United States Patent
Donnelly et al.

(10) Patent No.: US 6,369,626 B1
(45) Date of Patent: *Apr. 9, 2002

(54) LOW PASS FILTER FOR A DELAY LOCKED LOOP CIRCUIT

(75) Inventors: Kevin S. Donnelly, San Francisco; Andy Chan, San Jose; Thomas H. Lee; Wayne Richardson, both of Cupertino; Jared L. Zerbe, Palo Alto; Chaofeng Huang, San Jose; Clemenz L. Portmann, Cupertino; Grace Tsang, Los Altos, all of CA (US)

(73) Assignee: Rambus Inc., Los Altos, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/966,721

(22) Filed: Nov. 10, 1997

Related U.S. Application Data

(63) Continuation-in-part of application No. 08/823,009, filed on Mar. 21, 1997, now abandoned.

(51) Int. Cl.[7] ................................................. H03L 3/00
(52) U.S. Cl. ........................ 327/157; 327/158; 327/554; 327/544; 327/537
(58) Field of Search ................................. 327/552, 558, 327/537, 536, 535, 538, 544, 157, 148

(56) References Cited

U.S. PATENT DOCUMENTS

| | | | |
|---|---|---|---|
| 4,468,689 A | | 8/1984 | Nagashima .................... 358/31 |
| 4,959,618 A | | 9/1990 | Shier ........................... 327/157 |
| 5,008,629 A | * | 4/1991 | Ohba et al. ................... 327/107 |
| 5,059,992 A | * | 10/1991 | Akiike ......................... 327/427 |
| 5,146,121 A | | 9/1992 | Searls et al. ................. 327/267 |
| 5,179,303 A | | 1/1993 | Searles et al. ............... 327/157 |
| 5,220,206 A | * | 6/1993 | Tsang et al. ................. 327/544 |
| 5,220,294 A | | 6/1993 | Ichikawa ..................... 331/17 |

(List continued on next page.)

FOREIGN PATENT DOCUMENTS

| | | |
|---|---|---|
| EP | 0405523 | 1/1991 |
| EP | 0614283 | 9/1994 |
| EP | 0718978 | 6/1996 |
| GB | 2183948 | 6/1987 |
| WO | 09522206 | 8/1995 |
| WO | 9805685 | 7/1998 |

OTHER PUBLICATIONS

Lee et al., "A 2.5 V CMOS Delay–Locked Loop for an 18 Mbit, 500 Magabyte/s DRAM", IEEE Journal of Solid–State Circuits, vol. 29, No. 12 Dec. 1994, pp. 1491–1496.

Sidiropoulos, et al., "A Semidigital Dual Delay–Locked Loop", IEEE Journal of Solid–State Circuits, vol. 32, No. 11, Nov. 1997, pp. 1683–1692.

You, et al., "An Improved Tail Current Source for Low Voltage Applications", IEEE Journal Soid–State Circuits, vol. 32, No. 8, Aug. 1997, pp. 1173–1179.

Primary Examiner—Dinh T. Le

(57) ABSTRACT

A low pass filter having a first mode of operation and a second mode of operation. The low pass filter includes a charging circuit, a capacitor circuit, and low power circuitry coupled to the capacitor circuit and the charging circuit. The capacitor circuit stores a first differential voltage when the low pass filter is operating in the first mode of operation. The capacitor circuit stores a second differential voltage when the low pass filter is operating in the second mode of operation. The second differential voltage is substantially equal to the first differential voltage. The charging circuit may include a charging current source coupled to a current steering circuit. The low pass filter may further include a load circuit coupled to the current steering circuit and the low power circuitry. The low pass filter may be used in a delay locked loop circuit or a phase locked loop circuit.

21 Claims, 19 Drawing Sheets

U.S. PATENT DOCUMENTS

| | | | |
|---|---|---|---|
| 5,241,220 A | | 8/1993 | Karlock ........................ 327/237 |
| 5,379,002 A | * | 1/1995 | Jokura .......................... 331/10 |
| 5,523,724 A | * | 6/1996 | Assar et al. ................. 331/1 A |
| 5,543,742 A | | 8/1996 | Takeda et al. ............... 327/232 |
| 5,554,945 A | | 9/1996 | Lee et al. .................... 327/105 |
| 5,572,158 A | * | 11/1996 | Lee et al. .................... 327/536 |
| 5,955,899 A | * | 9/1999 | Afghahi ....................... 327/544 |

* cited by examiner

LOW PASS FILTER FOR A DELAY LOCKED LOOP CIRCUIT

CROSS-REFERENCE TO RELATED APPLICATIONS

This is a continuation-in-part application of prior application Ser. No. 08/823,009 entitled "A LOW PASS FILTER FOR A DELAY LOCKED LOOP CIRCUIT" filed on Mar. 21, 1997 now abandoned.

FIELD OF THE INVENTION

The present invention pertains to the field of low pass filter circuits. More particularly, the present invention relates to a low pass filter for a delay locked loop circuit.

BACKGROUND OF THE INVENTION

A delay locked loop circuit (DLL) or phase locked loop circuit is often employed within an integrated circuit device to generate an on-chip clock signal precisely positioned in a desired alignment with an external reference clock.

FIG. 1a illustrates a conventional delay locked loop circuit 100. An external reference clock REFCLK is compared to an on-chip clock signal INTCLK by phase detector 102. Phase detector 102 measures the error or difference between REFCLK and INTCLK and generates voltages on lines 132 and 134. The voltages on lines 132 and 134 indicate whether REFCLK should be adjusted relative to INTCLK. The voltage on line 132 is coupled to p-channel MOSFET 118 of loop filter 104, and the voltage on line 134 is coupled to p-channel MOSFET 120 of loop filter 104.

Loop filter 104 is an integrator or charge pump that averages and smoothes the phase detector output voltages on lines 132 and 134. Loop filter 104 is also a differential circuit that stores loop state or phase lock information as the difference between control voltages stored on capacitors 128 and 130. Capacitors 128 and 130 are coupled to lines 136 and 138, respectively, and to lines 144 and 146, respectively.

The control voltages on lines 136 and 138 are coupled to voltage controlled delay element 106. The difference between the control voltages on lines 136 and 138 indicates an amount of time that voltage controlled delay element 106 should be adjusted such that on-chip clock signal INTCLK is adjusted to a predetermined alignment with external reference clock REFCLK. Voltage controlled delay element 106 is coupled to clock buffer 108. Clock buffer 108 generates on-chip clock signal INTCLK.

Delay locked loop circuit 100 has two operating modes. The first operating mode is a normal operating mode. During the normal operating mode delay locked loop circuit 100 consumes a certain amount of power.

The second operating mode is a low power mode. The lower power mode shuts off REFCLK and eliminates the power dissipated due to REFCLK and/or INTCLK. Delay locked loop circuit 100 consumes considerably less power when operating in the low power mode than when operating in the normal mode.

When delay locked loop circuit 100 operates in the normal operating mode, control signal LPW* is high and p-channel MOSFET 112 is off. P-channel MOSFET 114 is driven by a bias source of I amperes from current source 122. P-channel MOSFETs 114 and 116 form a current mirror circuit. Therefore, a current proportional to I amperes also flows through p-channel MOSFET 116.

The current flowing through p-channel MOSFET 116 is steered by the differential current steering circuit formed by p-channel MOSFETs 118 and 120. When the voltage on line 134 is low and the voltage on line 132 is high, the current flowing through p-channel MOSFET 116 is steered to capacitor 128 and load circuitry 109 when the charging current is greater than the load current of load circuitry 109. Similarly, when the voltage on line 132 is low and the voltage on line 134 is high, the current flowing through p-channel MOSFET 116 is steered to capacitor 130 and load circuitry 109.

FIG. 1b illustrates one embodiment of load circuitry 109 including common mode circuitry 110 and discharging current sources 124 and 126.

FIG. 1c illustrates another embodiment of load circuitry 109 including n-channel MOSFET transistors 140, 142, 144, and 146.

FIG. 2 further illustrates the operation of delay locked loop circuit 100. Waveform A corresponds to the signal on line 132. Waveform B corresponds to the signal on line 134. Waveform C corresponds to the control signal LPW*. Waveform D corresponds to the signal on line 136. Waveform E corresponds to the signal on line 138. Waveforms A–E are illustrative waveforms to aide in the understanding of the operation of delay locked loop circuit 100. They are not actual measured or simulated waveforms.

From time t0 to time t1 delay locked loop circuit 100 is in a locked state and stores loop state information on capacitors 128 and 130. In the locked state, load circuitry 109 sets the common mode voltage on lines 136 and 138, respectively. For one embodiment, waveform D may be approximately 1300 millivolts (mV), and waveform E may be approximately 900 mV. Thus, delayed locked loop circuit 100 may have a starting differential voltage of 400 mV and a starting common mode voltage of 1100 mV.

While delay locked loop circuit 100 is in the locked state, the voltages on lines 132 and 134 may toggle once per clock cycle of REFCLK. Each toggle may cause a change in the voltages stored on capacitors 128 and 130 and lines 136 and 138, as illustrated in FIG. 2.

At time t1, delay locked loop circuit 100 switches to the low power mode. In the low power mode, control signal LPW* is low and p-channel MOSFET 112 is on. P-channel MOSFET 112 pulls the gate of p-channel MOSFET 116 to VDD which cuts off p-channel MOSFET 116. When p-channel MOSFET 116 is off, no charging current is available to be steered by p-channel MOSFETs 118 and 120 to capacitors 128 and 130.

As illustrated in FIG. 2, when no charging current is available from p-channel MOSFET 116 at time t1, load circuitry 109 discharges the voltages stored on capacitors 128 and 130 to ground. Thus, delay locked loop circuit 100 becomes unlocked as the differential loop state information stored on capacitors 128 and 130 collapses or is lost.

When delay locked loop circuit 100 is switched from low power mode to normal operating mode at time t2, the common mode voltage (e.g. 1100 mV) and the differential loop state information on capacitors 128 and 130 must be reacquired. A long period of time is required to reacquire phase lock at time t3. For example, if capacitors 128 and 130 are each approximately 20 picofarads (pF), and the charging current is approximately 10 microamperes ($\mu$A), then the time required to reacquire phase lock after switching from low power mode to normal mode may be approximately 2.2 microseconds ($\mu$S) (i.e., 1100 mV/(10 $\mu$A/20 pF)).

Thus, when low pass filter 104 enters low power mode at time t1 and exits lower power mode at time t2, there is a common mode disturbance or error on lines 136 and 138. As illustrated in FIG. 2, this common mode disturbance is the full common mode voltage. For example, the common mode disturbance is 1100 mV.

SUMMARY OF THE INVENTION

One object of the present invention is to provide a delay locked loop circuit having a low pass filter that can quickly switch from low power mode to normal operating mode.

Another object of the present invention is to provide a delay locked loop circuit having a low pass filter that can switch from normal operating mode to low power mode without losing phase lock.

Another object of the present invention is to provide a delay locked loop circuit having a low pass filter that can switch from low power mode to normal operating mode and quickly reacquire phase lock.

Another object of the present invention is to provide a delay locked loop circuit having a low pass filter that can switch from low power mode to normal operating mode without having to reacquire phase lock.

A low pass filter having a first mode of operation and a second mode of operation is described. The low pass filter includes a charging circuit, a capacitor circuit, and low power circuitry coupled to the capacitor circuit and the charging circuit. The capacitor circuit stores a first differential voltage when the low pass filter is operating in the first mode of operation. The capacitor circuit stores a second differential voltage when the low pass filter is operating in the second mode of operation. The second differential voltage is substantially equal to the first differential voltage. The charging circuit may include a charging current source coupled to a current steering circuit. The low pass filter may further include a load circuit coupled to the current steering circuit and the low power circuitry. The low pass filter may be used in a delay locked loop circuit, a phase locked loop circuit, or a duty cycle corrector.

Other features and advantages of the present invention will be apparent from the accompanying drawings and from the detailed description that follows.

BRIEF DESCRIPTION OF THE DRAWINGS

The present invention is illustrated by way of example and not limitation in the figures of the accompanying drawings, in which like references indicate similar elements and in which:

FIG. 1B is a circuit diagram of a prior art embodiment of the load circuitry of FIG. 1a;

FIG. 1 is a circuit diagram of another prior art embodiment of the load circuitry of FIG. 1a;

DETAILED DESCRIPTION

Figure 3:
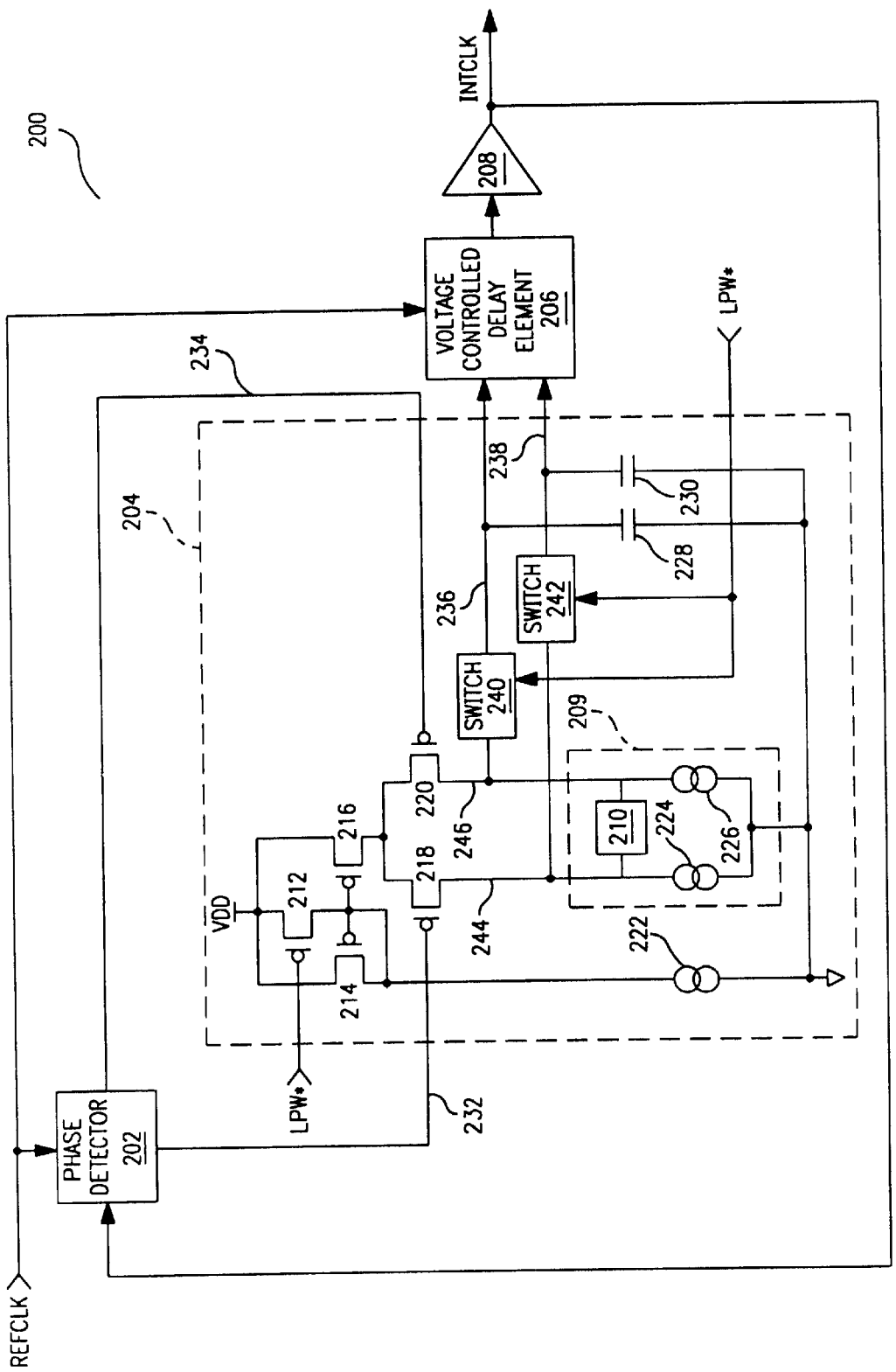
FIG. 3 is a circuit diagram of a delay locked loop circuit including a phase detector, a voltage controlled delay element, a clock buffer, and one embodiment of a low pass filter.

FIG. 3 shows delay locked loop circuit 200. Delay locked loop circuit 200 includes low pass filter 204 coupled to phase detector 202 and voltage controlled delay element 206. Voltage controlled delay element 206 is coupled to clock buffer 208.

As will be described in more detail below, low pass filter 204 includes a charging current source, a current steering circuit coupled to the charging current source, load circuitry coupled to the current steering circuit, a capacitor circuit, and low power circuitry coupled to the current steering circuit, the load circuitry, and the capacitor circuit. The capacitor circuit stores a first differential voltage when low pass filter 204 operates in a normal mode of operation. The capacitor circuit also stores a second differential voltage when low pass filter 204 operates in a low power mode of operation. The second differential voltage is substantially equal to the first differential voltage. Thus, when delay locked loop circuit 200 switches from normal mode to low power mode, delay locked loop circuit 200 retains its locked loop state information. Additionally, when delay locked loop circuit 200 switches from low power mode to normal mode minimal disturbance is caused to the locked state information.

Delay locked loop circuit 200 receives reference clock REFCLK. For one embodiment, REFCLK is a clock signal external to an integrated device in which delay locked loop circuit 200 resides. For another embodiment, REFCLK is any signal that will be phase-locked with another signal.

REFCLK is compared to an on-chip clock signal INTCLK by phase detector 202. INTCLK is a signal that will be phase-locked with REFCLK by delay locked loop circuit 200. INTCLK may be used within an integrated circuit device in which delay locked loop circuit 200 resides.

Phase detector 202 measures the phase error or difference between REFCLK and INTCLK and generates voltages on lines 232 and 234 in proportion to the phase error. The voltages on lines 232 and 234 may comprise logical complements of one another. The voltages on lines 232 and 234 indicate whether REFCLK should be adjusted relative to INTCLK. The voltage on line 232 is coupled to p-channel MOSFET 218 of low pass filter 204, and the voltage on line 234 is coupled to p-channel MOSFET 220 of low pass filter 204.

Low pass filter 204 is an integrator or charge pump that averages and smoothes the phase detector output voltages on lines 232 and 234. Low pass filter 204 is also a differential circuit that stores loop state or phase lock information as the difference between control voltages stored on capacitors 228 and 230. Capacitors 228 and 230 are coupled to lines 236 and 238, respectively, and to lines 244 and 246, respectively.

The control voltages on lines 236 and 238 are coupled to voltage controlled delay element 206. The difference between the control voltages on lines 236 and 238 indicates an amount of time that voltage controlled delay element 206 should be adjusted such that on-chip INTCLK is adjusted to a desired alignment with reference clock REFCLK. Voltage controlled delay element 206 is coupled to clock buffer 208.

Clock buffer 208 generates on-chip clock signal INTCLK. For one embodiment, clock buffer 208 comprises multiple clock buffers. For another embodiment, clock buffer 208 comprises one clock buffer.

Figure 1A:
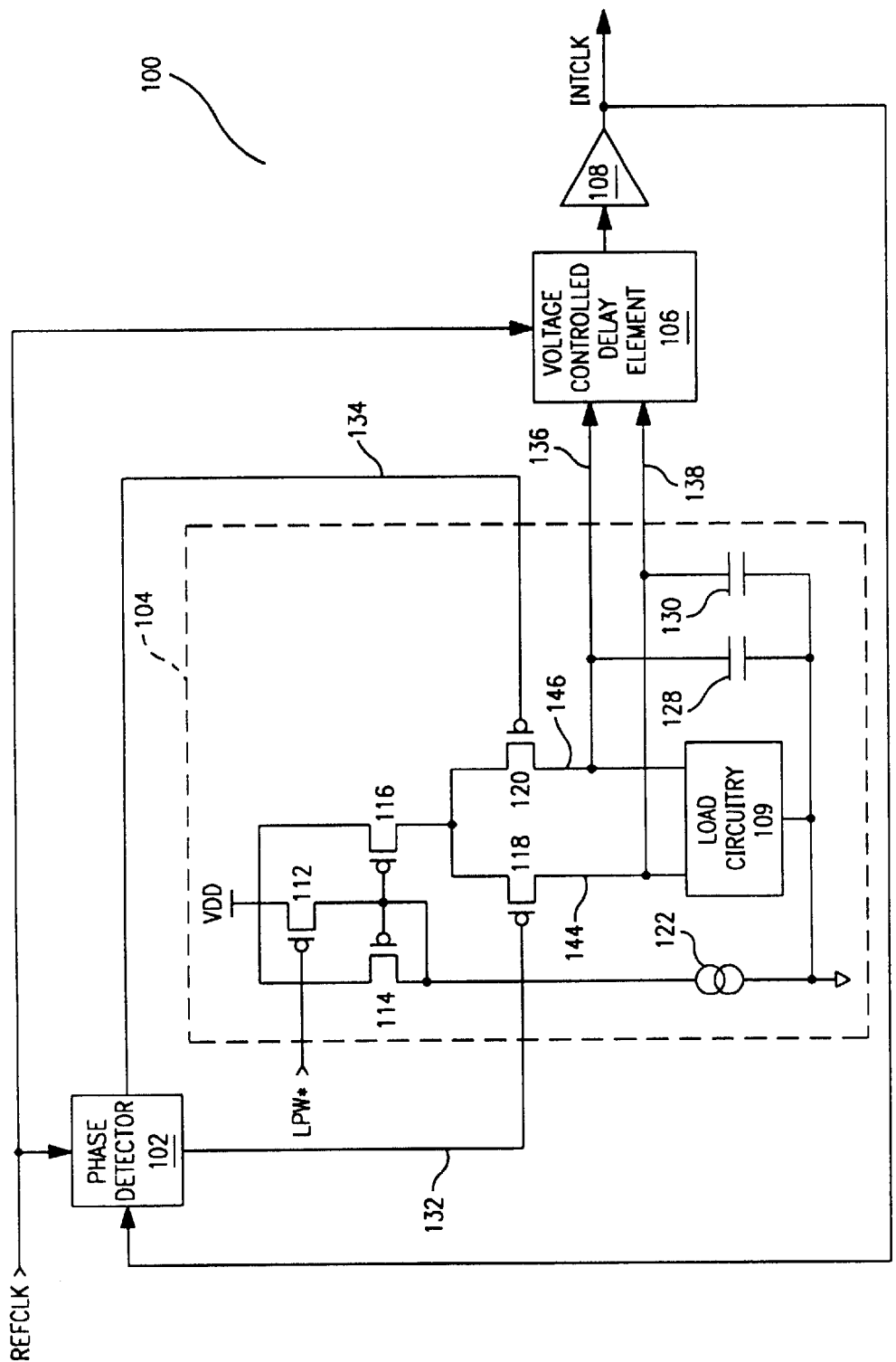
FIG. 1A is circuit diagram of a prior art delay locked loop circuit.
Figure 1B:
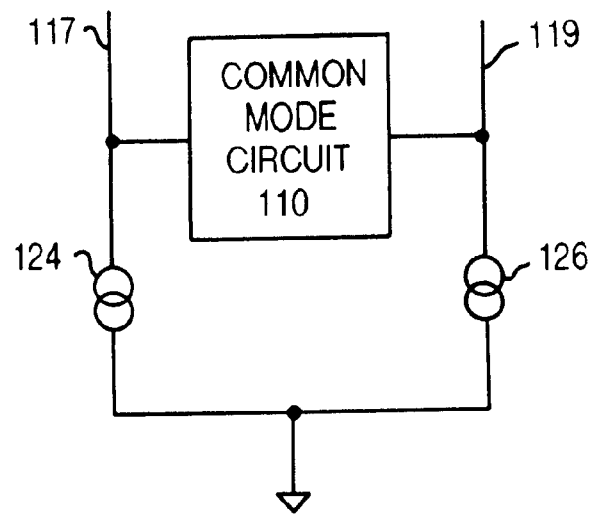

Low pass filter 204 also includes load circuitry 209. Load circuitry 209 may include the circuitry illustrated in FIG. 1a and FIG. 1b or any other suitable circuitry. As illustrated in FIG. 3, load circuitry 209 includes common mode circuitry 210 coupled to lines 244 and 246, respectively, and discharging current source circuitry including discharging current sources 224 and 226 coupled to lines 244 and 246, respectively. Discharging current sources 224 and 226 may include n-channel or p-channel MOSFETs configured as generally known in the art.

Common mode circuitry 210 may comprise any circuitry known in the art that sets a common mode on lines 244 and 246. This includes common mode circuitry which uses common mode feedback circuitry, and common mode circuitry which does not use common mode feedback circuitry.

Delay locked loop circuit 200 has at least two operating modes. The first operating mode is a normal operating mode. During the normal operating mode delay locked loop circuit 200 consumes a certain amount of power.

The second operating mode is a low power mode. In the low power mode, REFCLK may be shut off or disabled for a period of time. Delay locked loop circuit 200 consumes considerably less power when operating in the low power mode than when operating in the normal mode. Similarly, circuits coupled to INTCLK may also consume less power when delay locked loop circuit 100 operates in the low power mode.

Similarly, low pass filter 204 has a normal mode of operation and a low power mode of operation. Low pass filter 204 operates in its normal mode when delay locked loop circuit 200 operates in its normal mode. Low pass filter 204 operates in its low power mode when delay locked loop circuit 200 operates in its low power mode.

Low pass filter 204 may further be included in a system that operates in a standby mode as will be discussed below in reference to FIG. 12.

Low pass filter 204 has low power circuitry including p-channel MOSFET 212, switch 240, and switch 242. For one embodiment, each of switch 240 and switch 242 may comprise a p-channel MOSFET, an n-channel MOSFET, a CMOS transmission gate (receiving LPW* and the logic inverse signal LPW), or any other type of switch element.

The low power circuitry is responsive to control signal LPW*. Control signal LPW* is coupled to each of p-channel MOSFET 212, switch 240, and switch 242. The asterisk symbol "*" will be used throughout this application following a signal name to indicate that a signal is an active low signal.

When LPW* is low, low pass filter 204 operates in the low power mode such that p-channel MOSFET 212 is conducting and switches 240 and 242 are open (do not conduct). When LPW* is high, low pass filter 204 operates in the normal operating mode such that p-channel MOSFET 212 is not conducting and switches 240 and 242 are closed (conduct). For an alternative embodiment, when LPW* is low, low pass filter 204 operates in the normal operating mode and when LPW* is high, low pass filter 204 operates in the low power mode.

In the normal operating mode, a charging current source supplies a charging current to a current steering circuit including p-channel MOSFETs 218 and 220. The charging current source includes current source 222 and a current mirror circuit formed by p-channel MOSFETs 214 and 216.

P-channel MOSFET 214 is driven by a bias source or reference current of I amperes from current source 222. P-channel MOSFETs 214 and 216 form a current mirror circuit. Therefore, a charging current of I amperes also flows through p-channel MOSFET 216. For one embodiment, the charging current may be 10 µA. For an alternative embodiment, the mirror ratio between p-channel MOSFETs 214 and 216 causes the charging current to comprise a current equal to I amperes multiplied by the current mirror ratio.

The charging current flowing through p-channel MOSFET 216 is steered by the differential current steering circuit formed by p-channel MOSFETs 218 and 220. When the voltage on line 234 is low and the voltage on line 232 is high, the current flowing through p-channel MOSFET 216 is steered to capacitor 228 via switch 240 and discharging current source 226 when the charging current is greater than the load current of discharging current source 226. For one embodiment, discharging current source 226 sinks one-half of the charging current and one-half the charging current is steered to capacitor 228.

Similarly, when the voltage on line 232 is low and the voltage on line 234 is high, the current flowing through p-channel MOSFET 216 is steered to capacitor 230 via switch 242 and discharging current source 224 when the charging current is greater than the load current of discharging current source 224. For one embodiment, discharging current source 224 sinks one-half the charging current and one-half the charging current is steered to capacitor 230.

Capacitors 228 and 230 form a capacitor circuit. The size of each of capacitors 228 and 230 may be appropriately determined based on the steered charging current, discharge current source circuitry and other components and specifications of low pass filter 204 and delay locked loop circuit 200. For one embodiment, capacitors 228 and 230 may each be approximately 1 pF to 100 pF. For another embodiment, capacitors 228 and 230 may each be approximately 19 pF. For yet another embodiment, capacitors 228 and 230 are each 17.8 pF. Capacitors 228 and 230 may comprise discrete components or may be formed by other well known techniques including using n-channel or p-channel MOSFETs.

For another embodiment, capacitors 228 and 230 may be replaced with one capacitor coupled between lines 236 and 238. The single capacitor is approximately twice the size of each of capacitors 228 and 230. For one embodiment, the single capacitor is approximately 2 pF to 200 pF. For another embodiment, the single capacitor is approximately 35–40 pF.

Figure 4:
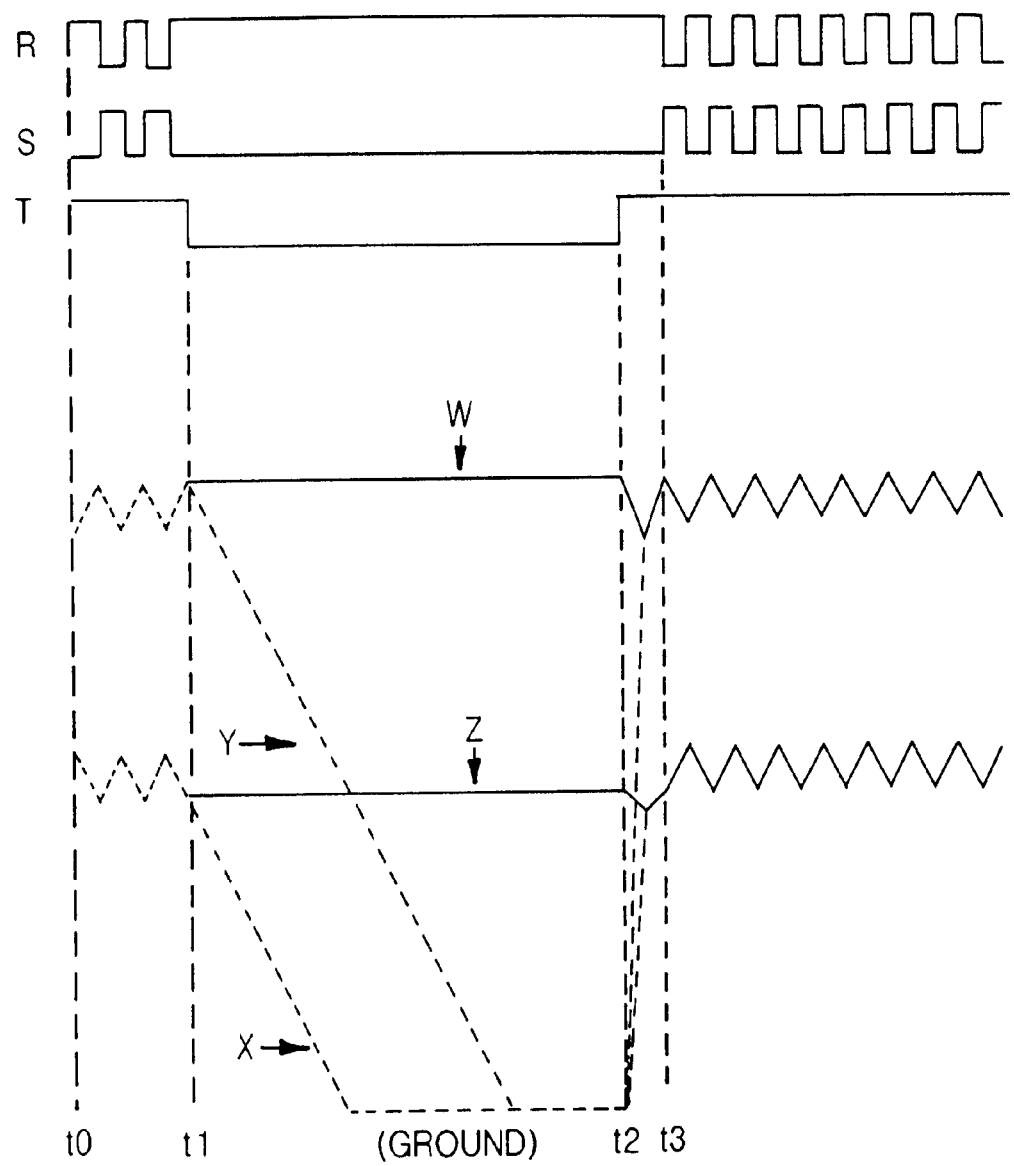
FIG. 4 is a waveform diagram illustrating the change in the differential loop state information as the delay locked loop circuit of FIG. 3 transitions from normal operating mode to low power mode and back to normal operating mode.

FIG. 4 further illustrates the operation of delay locked loop circuit 200 and low pass filter 204. Waveform R corresponds to the signal on line 232. Waveform S corresponds to the signal on line 234. Waveform T corresponds to the control signal LPW*. Waveform X corresponds to the signal on line 244. Waveform Y corresponds to the signal on line 246. Waveform W corresponds to the signal on line 236. Waveform Z corresponds to the signal on line 238. Waveforms R–Z are illustrative waveforms to aide in the understanding of the operation of delay locked loop circuit 200 and low pass filter 204. They are not actual measured or simulated waveforms.

From time t0 to time t1, delay locked loop circuit 200 is in a locked state and stores loop state information on capacitors 228 and 230. The loop state information is stored as a differential voltage. In the locked state, common mode circuitry 210 and discharging current sources 224 and 226 set the common mode voltage and the differential mode voltage on lines 244 and 246, respectively. For one embodiment, the common mode voltage for lines 244 and 246 may be approximately 1100 mV. For one embodiment, the differential mode voltage may be approximately 400 mV. The common mode voltage and differential mode voltage may be other values as well.

While delay locked loop circuit 200 is in the locked state, the voltages on lines 232 and 234 may toggle once per clock cycle of REFCLK. Each toggle may cause a change in the differential voltage stored on capacitors 228 and 230 and lines 236 and 238 as illustrated in FIG. 4.

At time t1, low pass filter 204 switches to the low power mode. In the low power mode, control signal LPW* is low, switches 240 and 242 are switched open, and p-channel MOSFET 212 is on. P-channel MOSFET 212 pulls the gate of p-channel MOSFET 216 to VDD which cuts off p-channel MOSFET 216. When p-channel MOSFET 216 is off, no charging current is available to be steered by p-channel MOSFETs 218 and 220 to capacitors 228 and 230.

As illustrated in FIG. 4, when no charging current is available from p-channel MOSFET 216 at time t1, discharging current sources 224 and 226 discharge the voltages on lines 244 and 246, respectively. The differential loop state information stored on capacitors 228 and 230 and on lines 236 and 238 is not lost because switch 240 and switch 242 are now open. When switch 240 and switch 242 are open, the voltages stored on capacitors 228 and 230 are not discharged by discharging current sources 224 and 226, respectively. Therefore, in the low power mode capacitors 228 and 230 store approximately the same differential voltage as that stored in normal operating mode.

Capacitors 228 and 230 may be very large (e.g., tens of picofarads) compared to typical parasitic capacitance of MOSFET transistors (e.g., one pF or less). Therefore, the low impedance on lines 236 and 238 renders capacitors 228 and 230 relatively insensitive to noise injection even while capacitor 228 and 230 are not actively being driven by the current steering circuit. Additionally, given that capacitors 228 and 230 are sensed differentially, noise immunity is further enhanced.

When low pass filter 204 is switched from low power mode to normal operating mode at time t2, the common mode voltage and the differential loop state information on capacitors 228 and 230 does not have to be reacquired because loop filter 204 retains its locked loop state information in the low power mode.

Practically, there is a common mode disturbance on lines 236 and 238. The common mode disturbance on line 236 is due to charge sharing between capacitor 228 and the parasitic and stray capacitance on line 246. The common mode disturbance on line 238 is due to charge sharing between capacitor 230 and the parasitic and stray capacitance on line 244. For one embodiment the parasitic and stray capacitance on each of line 244 and 246 may be approximately 0.4 picofarads. For another embodiment, the parasitic and stray capacitance on each of lines 244 and 246 may be approximately one pF.

Charge sharing occurs because lines 244 and 246 have been discharged by discharging current sources 224 and 226, respectively, to a potential different from that stored on capacitors 228 and 230. Therefore, when low pass filter 204 transitions from low power mode to normal operating mode at time t2 (switches 240 and 242 close), lines 244 and 246 are charged towards the starting common mode and differential mode voltages by both the charging current steered through the current steering circuit and the charge stored on capacitors 228 and 230. The charge used from capacitors 228 and 230 to charge lines 244 and 246 causes a corresponding drop in the voltages stored on capacitors 228 and 230.

Due to the charge sharing, low pass filter 204 re-establishes a new common mode voltage and differential mode voltage at time t2 that are different from the starting values at time t0. For one embodiment, each of capacitors 228 and 230 are approximately 19 pF, and the parasitic and stray capacitance on each of lines 244 and 246 is approximately one pF. For this embodiment, one of ordinary skill in the art will appreciate that the voltages on lines 236 and 238 may each be approximately 5 percent lower at time t2 than they were at time t0 (e.g., 1 pF/(1 pF+19 pF)). Thus, if at time t0 the voltages on lines 238 and 238 are approximately 1300 mV and 900 mV, respectively, then at time t2 the voltages on lines 236 and 238 will be approximately 1235 mV (i.e., 1300 mV*19 pF/(1 pF+19 pF)) and 855 mV (i.e., 900 mV*19 pF/(1 pF+19 pF)), respectively. The differential voltage at time t2 will be approximately 380 mV, and the differential error will be approximately 20 mV (i.e., 400 mV−380 mV). The common mode voltage at time t2 will be approximately 1045 mV, and the common mode error will be approximately 55 mV (i.e., 1100 mV−1045 mV). For this embodiment, low pass filter 204 and delay locked loop circuit 200 may reacquire phase lock in approximately 40 nanoseconds (nS) (i.e., 20 mV/(10 μA/20 pF)) at time t3. This is significantly faster than the approximately 2.5 μS for delay locked loop circuit 100 of FIG. 1a.

Switch 240 and switch 242 may inject undesired charge onto lines 236 and 238 when switches 240 and 242 are either turned on or turned off. Much of the injected charge results from the fact that the switch control signal LPW* swings through a very large voltage excursion, for example, the entire rail-to-rail power supply voltage. Many switch designs take steps to reduce or suppress the undesired charge injection. Such well known switch designs may be used for switch 240 and switch 242.

Figure 5:
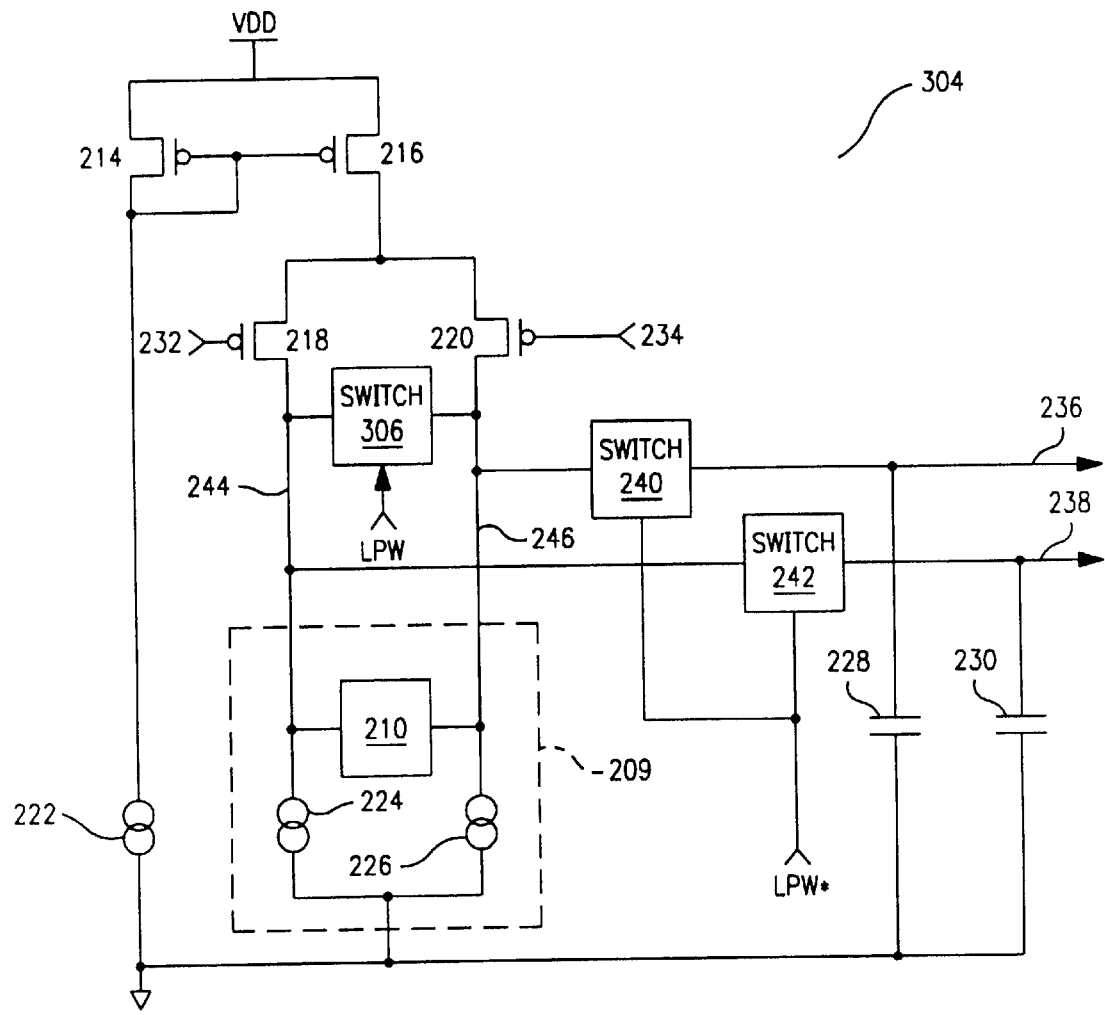
FIG. 5 is a circuit diagram of another embodiment of a low pass filter.

FIG. 5 is a low pass filter 304 which may be used in place of low pass filter 204 in delay locked loop circuit 200. Low pass filter 304 has a normal mode of operation and a low power mode of operation. Low pass filter 304 operates in its normal mode when delay locked loop circuit 200 operates in its normal mode. Low pass filter 304 operates in its low power mode when delay locked loop circuit 200 operates in its low power mode.

Low pass filter 304 has low power circuitry including switch 306, switch 240, and switch 242. For one embodiment, each of switch 240, switch 242, and switch 306 may include a p-channel MOSFET, a n-channel MOSFET, a CMOS transmission gate (receiving LPW* and the logic inverse signal LPW), or any other type of switch element. Each of switch 240, switch 242, and switch 306 may also include a switch element that reduces injected current onto lines 236 and 238, and nodes 244 and 246 when LPW* and LPW transition states.

The low power circuitry is responsive to control signals LPW and LPW*. Control signal LPW* is coupled to switch 240 and switch 242. The logical complement of control signal LPW*, namely LPW, is coupled to switch 306.

Figure 6:
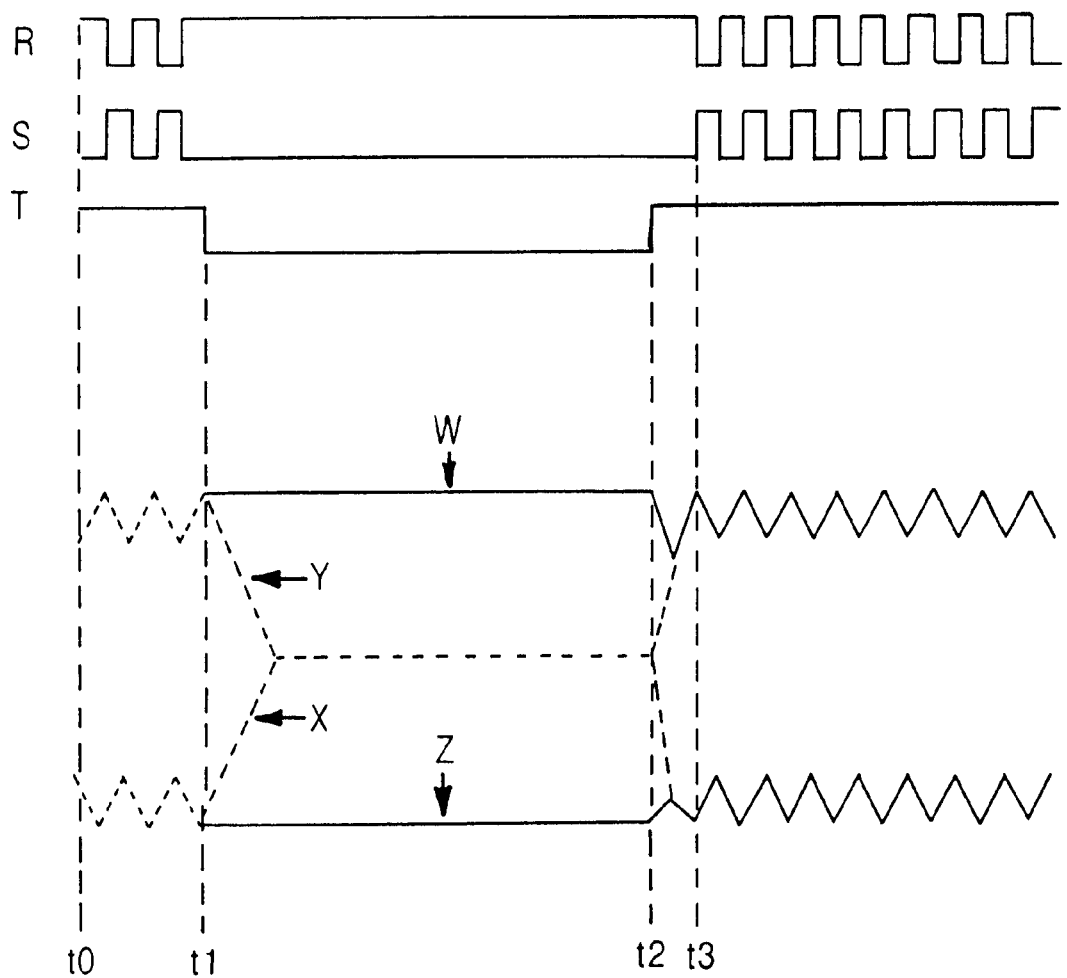
FIG. 6 is a waveform diagram illustrating the change in the differential loop state information as the delay locked loop circuit of FIG. 5 transitions from normal operating mode to low power mode and back to normal operating mode.

With reference to FIGS. 5 and 6, waveform R corresponds to the signal on line 232. Waveform S corresponds to the signal on line 234. Waveform T corresponds to the control signal LPW*. Waveform X corresponds to the signal on line 244. Waveform Y corresponds to the signal on line 246. Waveform W corresponds to the signal on line 236. Waveform Z corresponds to the signal at node 238. Waveforms R–Z are illustrative waveforms to aide in the understanding of the operation of low pass filter 304. They are not actual measured or simulated waveforms.

At time t0, LPW* is high and low pass filter 304 operates in the normal operating mode. When LPW* is high, switches 240 and 242 are closed (conduct). A charging current will be generated by the charging current source circuitry including current source 222 and p-channel MOSFETs 214 and 216. The charging current is provided to the current steering circuitry formed by p-channel MOSFETs 218 and 220. The voltages on lines 232 and 234 will determine whether the charging current is steered to capacitor 228 and discharging current source 226, or to capacitor 230 and discharging current source 224.

When LPW* is high, LPW is low. Switch 306 is off and disconnects line 244 from line 246 when low pass filter 304 operates in the normal operating mode. For one embodiment, switch 306 includes a n-channel MOSFET having its gate coupled to LPW and its source and drain coupled to lines 244 and 246, respectively.

For an alternative embodiment, when LPW* is high, low pass filter 304 operates in the low power mode and switches 240 and 242 are open (do not conduct). Therefore, switch 306 will short line 244 to line 246 when low pass filter 304 operates in the low power mode. For one embodiment, switch 306 includes a p-channel MOSFET having its gate coupled to LPW* and its source and drain coupled to nodes 244 and 246, respectively.

At time t1, LPW* transitions to low and low pass filter 304 operates in the low power mode. When LPW* is low, switches 240 and 242 are open (do not conduct). As previously described, when switches 240 and 242 are open, the voltages stored on capacitors 228 and 230 are not discharged by discharging current sources 224 and 226, respectively; rather, the differential loop state information is preserved on capacitors 228 and 230.

Low pass filter 304 does not include p-channel MOSFET 212. Thus, when low pass filter 304 operates in the low power mode, a charging current will be provided to the current steering circuit of p-channel MOSFETs 218 and 220. The steered charging current will then be supplied to either line 244 or line 246.

When low pass filter 304 operates in the low power mode, LPW is high and switch 306 shorts line 244 to line 246. As illustrated in FIG. 6, switch 306 will drive lines 244 and 246 to the common mode voltage, that is, switch 306 will drive lines 244 and 246 to the average of the differential voltage stored on capacitors 228 and 230 before low power mode was entered.

When low power mode is exited and normal operating mode is entered at time t2, switches 240 and 242 close and switch 306 opens. Given that lines 244 and 246 did not discharge to ground while low pass filter was in the low power mode, the amount of common mode disturbance on lines 236 and 238 is approximately zero.

Due to the charge sharing, low pass filter 304 re-establishes a new common mode voltage and differential mode voltage at time t2 that are different from the starting values at time t0. For one embodiment, each of capacitors 228 and 230 are approximately 19 pF, and the parasitic and stray capacitance on each of lines 244 and 246 is approximately one pF. In contrast to low pass filter 204 of FIG. 3, the parasitic and stray capacitance on each of lines 244 and 246 are already charged to the common mode voltage (e.g., approximately 1100 mV) at time t2. Thus, if at time t0 the voltages on lines 236 and 238 are approximately 1300 mV and 900 mV, respectively, then at time t2 the voltages on lines 236 and 238 will be approximately 1290 mV and 910 mV, respectively. One of ordinary skill in the art will appreciate that the voltage at time t2 on either of lines 244 or 246 will be approximately equal to V1*(C1/Ct)+V2*(C2/Ct) where Ct=C1+C2, V1 is the voltage on lines 236 or 238 at time t2, V2 is the common mode voltage (e.g., 1100 mV), for line 244 or 246 set by common mode circuitry 210, C1 is the parasitic and stray capacitance on line 244 or 246, and C2 is the capacitance of capacitor 228 or 230. The differential voltage at time t2 may be approximately 380 mV, and the differential error may be approximately 20 mV (i.e., 400 mV–380 mV). For this embodiment, low pass filter 304 may reacquire phase lock in approximately 40 nS at time t3. This is significantly faster than the approximately 2.5 μS for delay locked loop circuit 100 of FIG. 1a.

Figure 7:
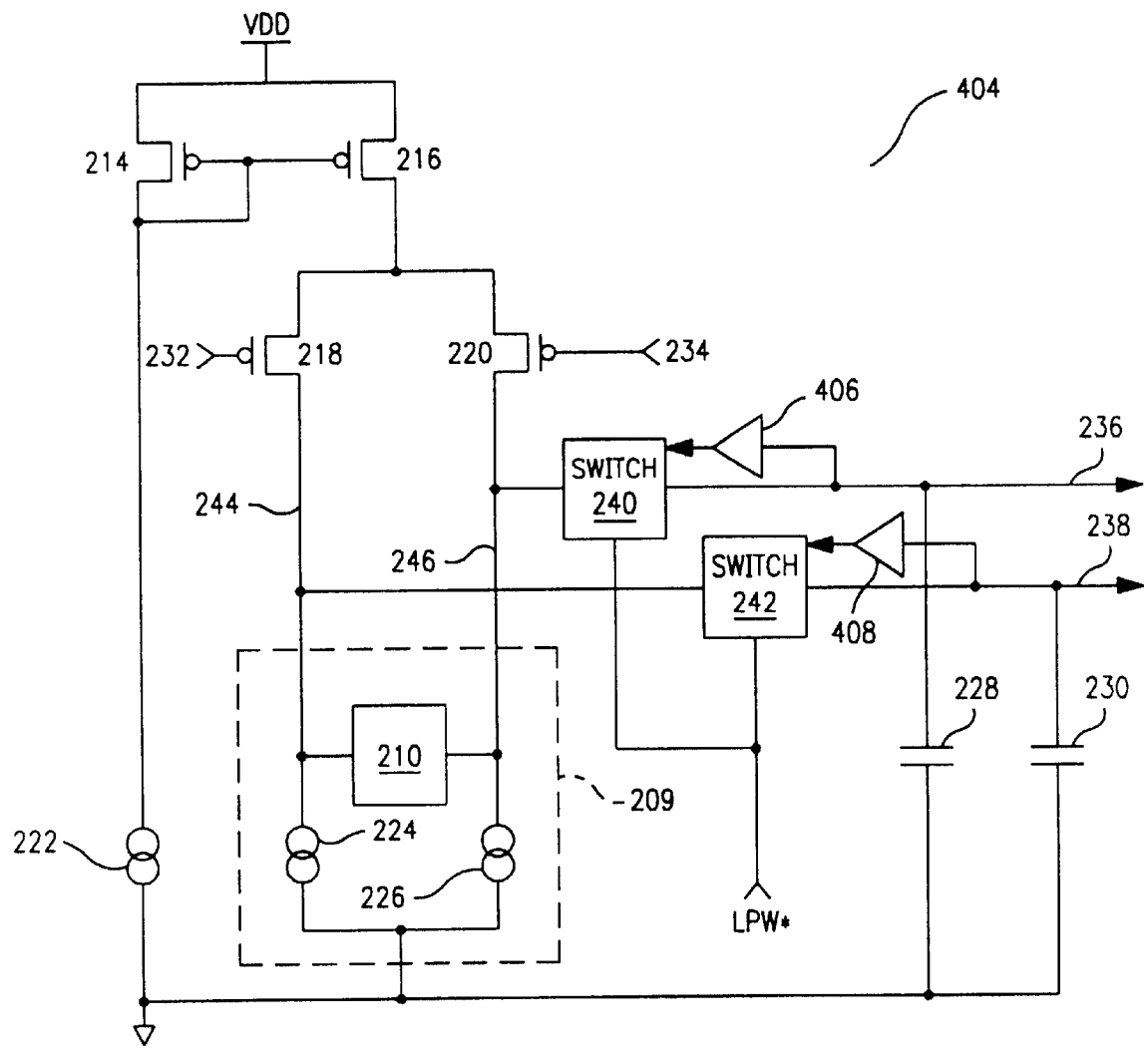
FIG. 7 is a circuit diagram of another embodiment of a low pass filter.

FIG. 7 is a low pass filter 404 which may be used in place of low pass filter 204 in delay locked loop circuit 200. Low pass filter 404 has at least a normal mode of operation and a low power mode of operation. Low pass filter 404 operates in its normal mode when delay locked loop circuit 200 operates in its normal mode. Low pass filter 404 operates in its low power mode when delay locked loop circuit 200 operates in its low power mode.

Low pass filter 404 has low power circuitry including switch 240, switch 242, amplifier 406, and amplifier 408. Amplifiers 406 and 408 each may be low power unity-gain amplifiers. The low power circuitry is responsive to control signal LPW*. Control signal LPW* is coupled to switch 240 and switch 242.

Figure 8:
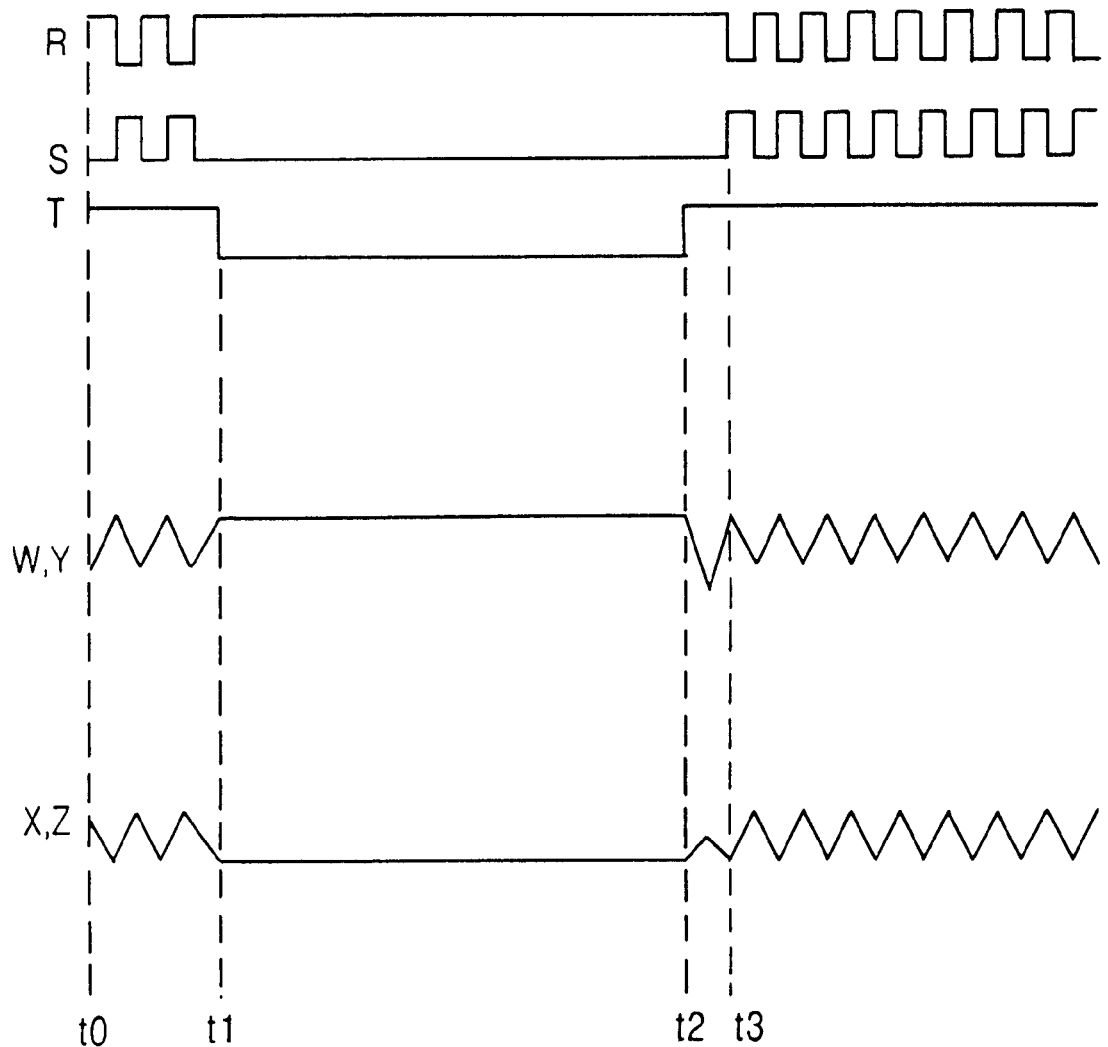
FIG. 8 is a waveform diagram illustrating the change in the differential loop state information as the delay locked loop circuit of FIG. 7 transitions from normal operating mode to low power mode and back to normal operating mode.

With reference to FIGS. 7 and 8, waveform R corresponds to the signal on line 232. Waveform S corresponds to the signal on line 234. Waveform T corresponds to the control signal LPW*. Waveform X corresponds to the signal on line 244. Waveform Y corresponds to the signal on line 246. Waveform W corresponds to the signal on line 236. Waveform Z corresponds to the signal on line 238. Waveforms R–Z are illustrative waveforms to aide in the understanding of the operation of low pass filter 404. They are not actual measured or simulated waveforms.

At time t0, LPW* is high and low pass filter 404 operates in the normal operating mode. When LPW* is high, switch 240 and switch 242 are each set to a first position. In the first position switch 240 couples line 246 to line 236 and capacitor 228. Similarly, in the first position switch 242 couples line 244 to line 238 and capacitor 230.

For one embodiment, each of switch 240 and switch 242 include two transistors. The two transistors receive LPW* and the logical inverse signal LPW. For example, switch 240 may include two p-channel MOSFETs such that the first p-channel MOSFET has its gate coupled to LPW and the second p-channel MOSFET has its gate coupled to LPW*. For another embodiment, each of switch 240 and switch 242 may include two CMOS transmission gates.

Switches 240 and 242 may also include any other type of switching element such that when LPW* is low switch 240 and switch 242 are each in the first position, and when LPW* is high switch 240 and switch 242 are each in a second position. For another embodiment, switch 240 and switch 242 may each be in the first position when LPW* is low and in the second position when LPW* is high. For another embodiment, switch 240 and switch 242 may each include a switch element that reduces injected current onto lines 236 and 238 when LPW* transitions states.

In the normal operating mode a charging current is generated by the charging current source circuitry including current source 222 and p-channel MOSFETs 214 and 216. The charging current is provided to the current steering circuitry of p-channel MOSFETs 218 and 220. The voltages on lines 232 and 234 determine whether the charging current is steered to capacitor 228 and discharging current source 226, or to capacitor 230 and discharging current source 224.

At time t1, LPW* transitions low and low pass filter 404 operates in the low power mode. Low pass filter 404 does not include p-channel MOSFET 212. Thus, when low pass filter 404 operates in the low power mode, a charging current will be provided to the current steering circuit of p-channel MOSFETs 218 and 220. The steered charging current will then be supplied to either line 244 or line 246.

When LPW* is low, switches 240 and 242 are each set to a second position. In the second position switch 240 couples the output of amplifier 406 to line 246 and capacitor 228 retains its stored voltage. Similarly, in the second position switch 242 couples the output of amplifier 408 to line 244 and capacitor 230 retains its stored voltage. Thus, in the low power mode capacitors 228 and 230 are not discharged by discharging current sources 224 and 226 respectively; rather, the differential loop state information is preserved on capacitors 228 and 230 and on the load circuitry 209.

When in the low power mode, lines 246 and 244 are driven to approximately or nearly the same voltage as the voltages stored on capacitors 228 and 230 by amplifiers 406 and 408 respectively. Therefore, there is approximately zero voltage across switch 240 and switch 242.

When low power mode is exited and normal operating mode is entered at time t2, switch 240 and switch 242 return to their first positions. Given that the voltages on nodes 244 and 246 equal the voltages on capacitors 230 and 228 respectively, there is approximately zero common mode error or disturbance, and approximately zero differential mode error on lines 236 and 238 as illustrated in FIG. 8. Therefore, low pass filter 404 will not lose phase lock.

Practically, amplifiers 406 and 408 both have gain errors and input offset voltage errors which cause their output voltages to not exactly equal their input voltages. These errors will exist across switches 240 and 242, and they will give rise to some common mode disturbance on lines 236 and 238. This common mode disturbance is due to charge sharing as low pass filter 404 enters and exits low power mode. One skilled in the art will appreciate that it is possible to reduce these gain and offset errors to values below one percent of the power supply voltage. This results in a very small amount of charge sharing disturbance on lines 236 and 238.

Low pass filter 404 maintains the loop state information differentially on capacitors 228 and 230. Thus, if there is a common mode offset from the input to the output of amplifiers 406 and 408, then when switch 240 and switch 242 are switched to the second position there will be a common mode disturbance; however, the voltage differential on lines 236 and 238 will remain undisturbed. Thus, amplifiers 406 and 408 produce a voltage differential output on lines 246 and 244 that approximately equals the voltage differential on capacitors 228 and 230, respectively.

Figure 9:
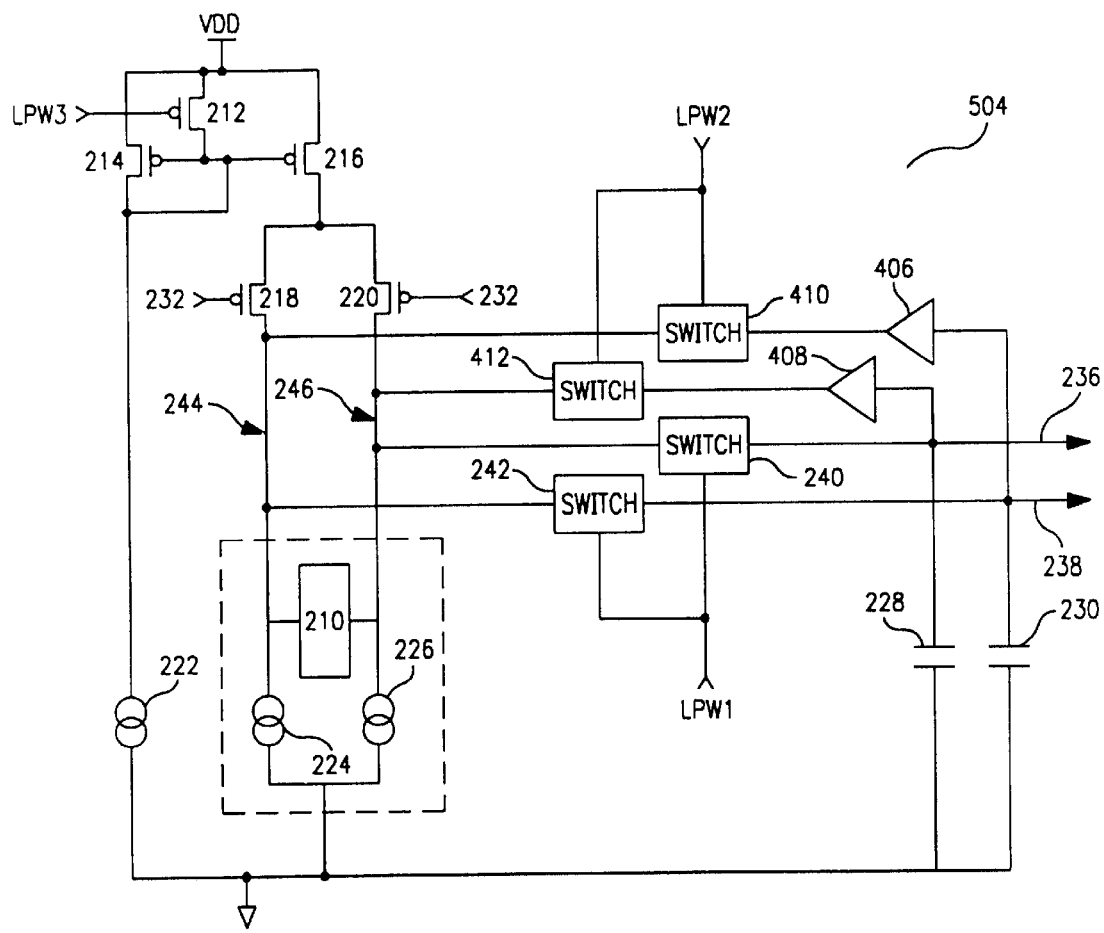
FIG. 9 is a circuit diagram of another embodiment of a low pass filter.

FIG. 9 is a low pass filter 504 which may be used in place of low pass filter 204 in delay locked loop circuit 200. Low pass filter 504 has at least a normal mode of operation and a low power mode of operation. Low pass filter 504 operates in its normal mode when delay locked loop circuit 200 operates in its normal mode. Low pass filter 504 operates in its low power mode when delay locked loop circuit 200 operates in its low power mode.

Low pass filter 504 has low power circuitry including transistor or switch 212, switches, 240, 242, 410, and 412, and feedback amplifiers 406 and 408. In contrast to low pass filter 404 of FIG. 7, low pass filter 504 includes transistor 212 and adds switches 410 and 412.

The low power circuitry is responsive to low power control signals LPW1, LPW2, and LPW3. In response to LPW1, switches 240 and 242 couple or decouple lines 246 and 244 to lines 236 and 238, respectively. Similarly, in response to LPW2, switches 410 and 412 couple or decouple lines 238 and 236, via feedback amplifiers 406 and 408, to lines 244 and 246, respectively. Transistor 212 has. its gate coupled to LPW3 and operates in a similar manner as discussed previously with respect to low pass filter 204 illustrated in FIG. 3.

For one embodiment, each of switches 240, 242, 410, and 412 include an n-channel MOSFET transistor, a p-channel MOSFET transistor, or a CMOS transmission gate. For example, switches 240 and 242 may include an n-channel MOSFET transistor having its gate coupled to LPW1, its drain/source coupled to line 244 or 246, and its source/drain coupled to line 236 or 238.

LPW1 and LPW2 may be the same signal, complements of each other, or may be unrelated signals. Similarly, LPW3 may the same signal as LPW1 and/or LPW2, may be the complement of LPW1 and/or LPW2, or may be unrelated to LPW1 and LPW2.

Figure 10:
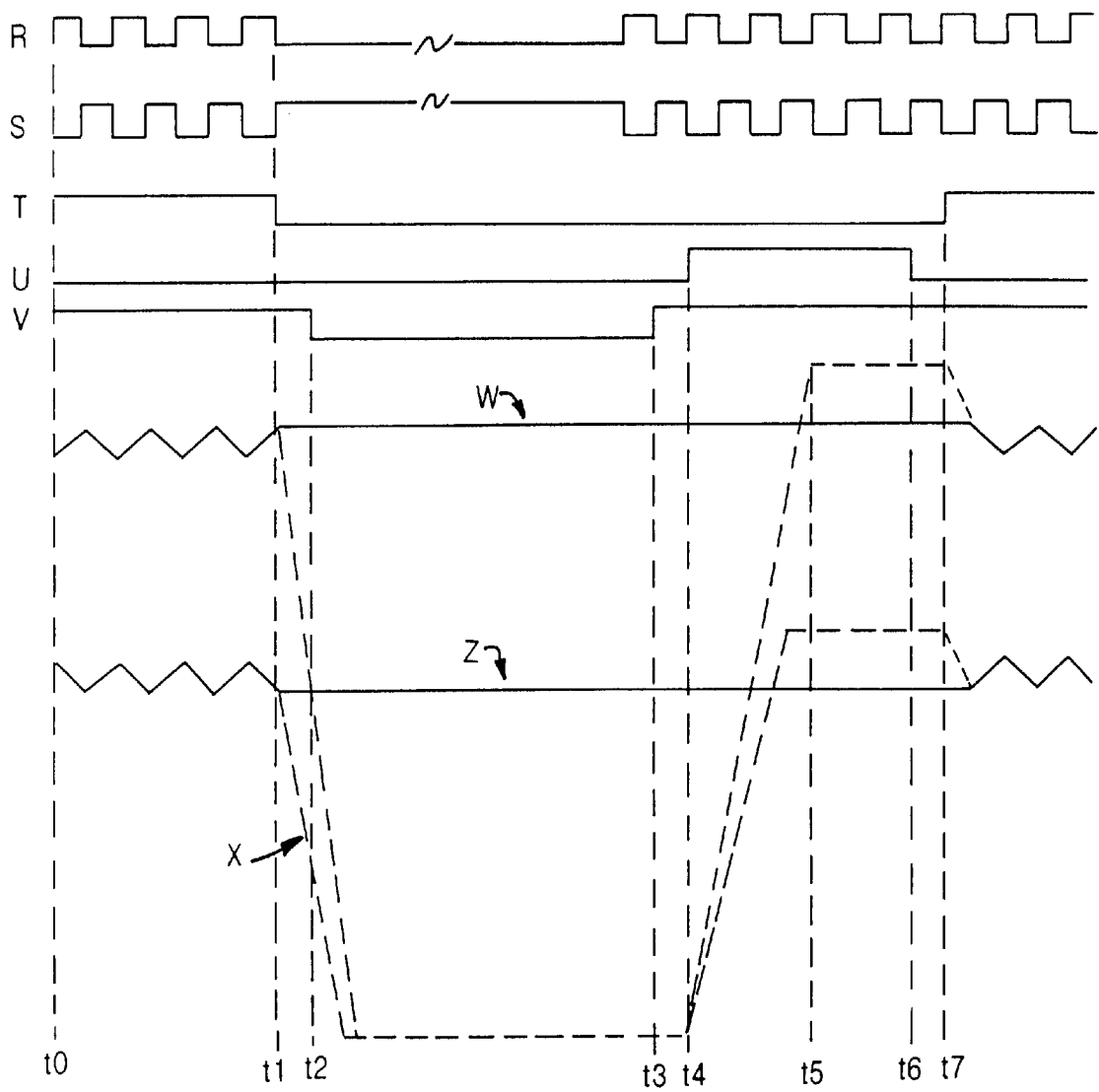
FIG. 10 is a waveform diagram illustrating the change in the differential loop state information as the delay locked loop circuit of FIG. 9 transitions from normal operating mode to low power mode and back to normal operating mode.

The operation of low pass filter 504 may be described with reference to FIGS. 9 and 10. In FIG. 10, waveform R corresponds to the signal on line 232. Waveform S corresponds to the signal on line 234. Waveform T corresponds to the control signal LPW1. Waveform U corresponds to the control signal LPW2. Waveform V corresponds to the control signal LPW3. Waveform X corresponds to the signal on line 244. Waveform Y corresponds to the signal on line 246. Waveform W corresponds to the signal on line 236. Waveform Z corresponds to the signal on line 238. Waveforms R–Z are illustrative waveforms to aide in the understanding of the operation of low pass filter 404. They are not actual measured or simulated waveforms.

At time t0, low pass filter 504 operates in the normal operating mode with LPW1 and LPW3 high and LPW2 low. When LPW1 is high, switch 240 conducts and couples line 246 to line 236 and capacitor 228, and switch 242 conducts and couples line 244 to line 238 and capacitor 230. When LPW2 is low, switches 410 and 412 do not conduct and isolate amplifiers 406 and 408 from lines 244 and 246, respectively. Also at time t0, LPW3 is high causing transistor 212 to be off. For other embodiments, switches 240, 242, 410, and 412 may respond to different logic states on LPW1, LPW2, and LPW3 than those previously or hereafter described.

In the normal operating mode, a charging current is generated by the charging current source circuitry including current source 222 and p-channel MOSFETs 214 and 216. The charging current is provided to the current steering circuitry of p-channel MOSFETs 218 and 220. The voltages on lines 232 and 234 determine whether the charging current is steered to capacitor 228 and discharging current source 226, or to capacitor 230 and discharging current source 224.

To switch to the low power mode of operation, first LPW1 transitions to a low state at time t1. When LPW1 is low, switches 240 and 242 do not conduct such that line 244 and 246 are isolated from lines 238 and 236, respectively. Once nodes 244 and 246 have been isolated from lines 238 and 236, respectively, then LPW3 transitions to a low state to shut down the current mirror circuit formed by transistors 214 and 216 so than no current flows onto lines 244 and 246 through current steering transistors 218 and 220. Low pass filter 504 thus enters the low power mode and remains there during between times t2 and t3. During the period between times t2 and t3, load circuit 209 discharges lines 244 and 246 to a value close to ground. During the low power mode, the differential loop state information is maintained on capacitors 228 and 230.

To switch low pass filter 504 back to normal operating mode, first LPW3 transitions to a high state at time t3. This enables the current mirror circuit and provide charging current to line 244 or 246 via current steering transistors 218 or 220, respectively.

Then at time t4, LPW2 transitions to a high state or enables switches 410 and 412 to conduct such that the voltage on capacitor 230 is coupled to line 244 via amplifier 406, and such that the voltage capacitor 228 is coupled to line 246 via amplifier 408. LPW2 may cause switches 410 and 412 to conduct for only so long as is required for line 244 and 246 to re-acquire the differential loop state information stored on capacitors 230 and 228 at time t5. At time t6, LPW2 transitions low causing switches 410 and 412 to not conduct. At time t7, LPW1 transitions high coupling lines 244 and 246 to lines 238 and 236, respectively.

Because in practice the amplifiers do not have exact unity gain but an offset voltage, the reestablished voltages on lines 244 and 246 may be slightly different from the voltages saved on capacitor 228 and 230. However, the differential voltage between lines 244 and 246 will be very close to the saved differential voltage across lines 236 and 238. Generally, only the differences between the gains of amplifiers 406 and 408 will introduce error in the differential voltage across line 244 and 246. As a result, low pass filter 504 will enable delay locked loop circuit 200 employing low pass filter 504 to re-establish lock very quickly.

Figure 11:
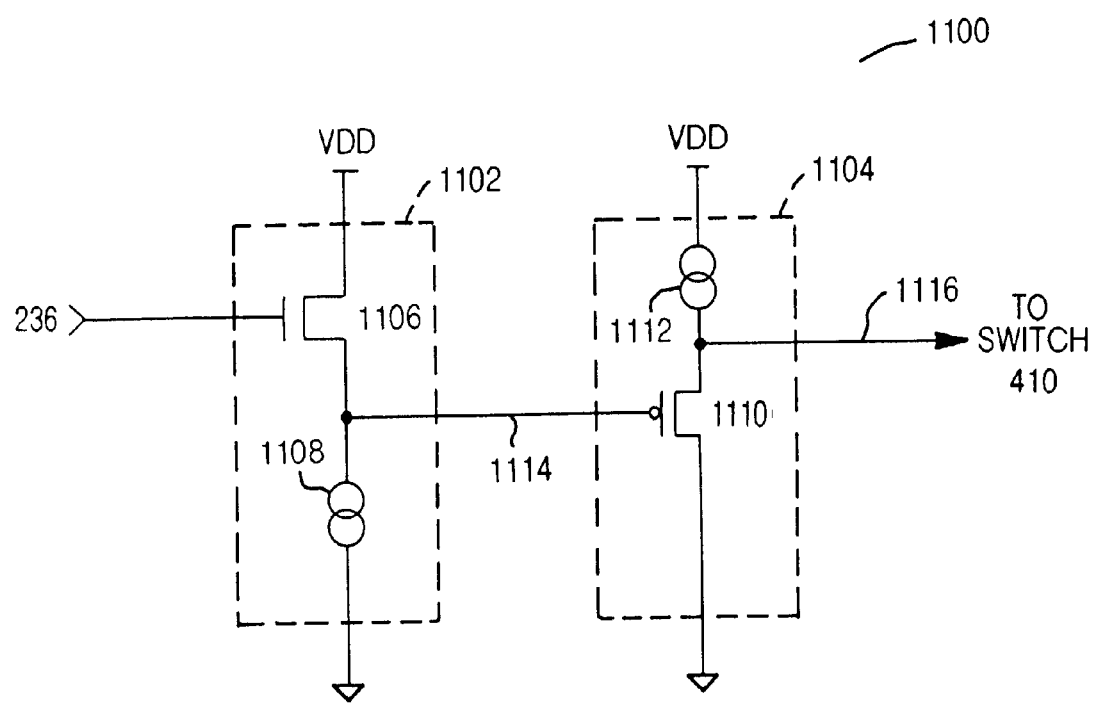
FIG. 11 is a circuit diagram of one embodiment of a feedback amplifier.

FIG. 11 illustrates feedback amplifier or buffer 1100 which may be used for feedback amplifiers 406 or 408 of FIG. 7 or 9. Amplifier 1100 includes source followers 1102 and 1104 coupled is series. Source follower 1102 includes n-channel MOSFET 1106 having its gate coupled to line 236, its drain coupled to VDD, and its source coupled to current source 1108. Source follower 1104 includes p-channel MOSFET having its source coupled to line 1116 (which is coupled to switch 410) and current source 1112, its drain coupled to ground, and its gate coupled to the line 1114. Line 1114 is coupled to the source of transistor 1106 and current source 1108. This arrangement produces approximately unity gain but with a small level shift between the voltage on line 236 and the voltage on line 1116. The level shift is caused by the fact that the voltage on line -1114 is one n-channel threshold, Vtn, below the voltage on line 236, and that the voltage on line 1116 is one p-channel threshold, Vtp, above the voltage on line 1114. Because Vtn does not match Vtp, the voltage on line 1116 may be slightly higher than the voltage on line 236. However, this occurs identically on both of amplifiers 410 and 412, so that the error in the difference between the voltages bed back to lines 244 and 246 is very small.

Figure 12:
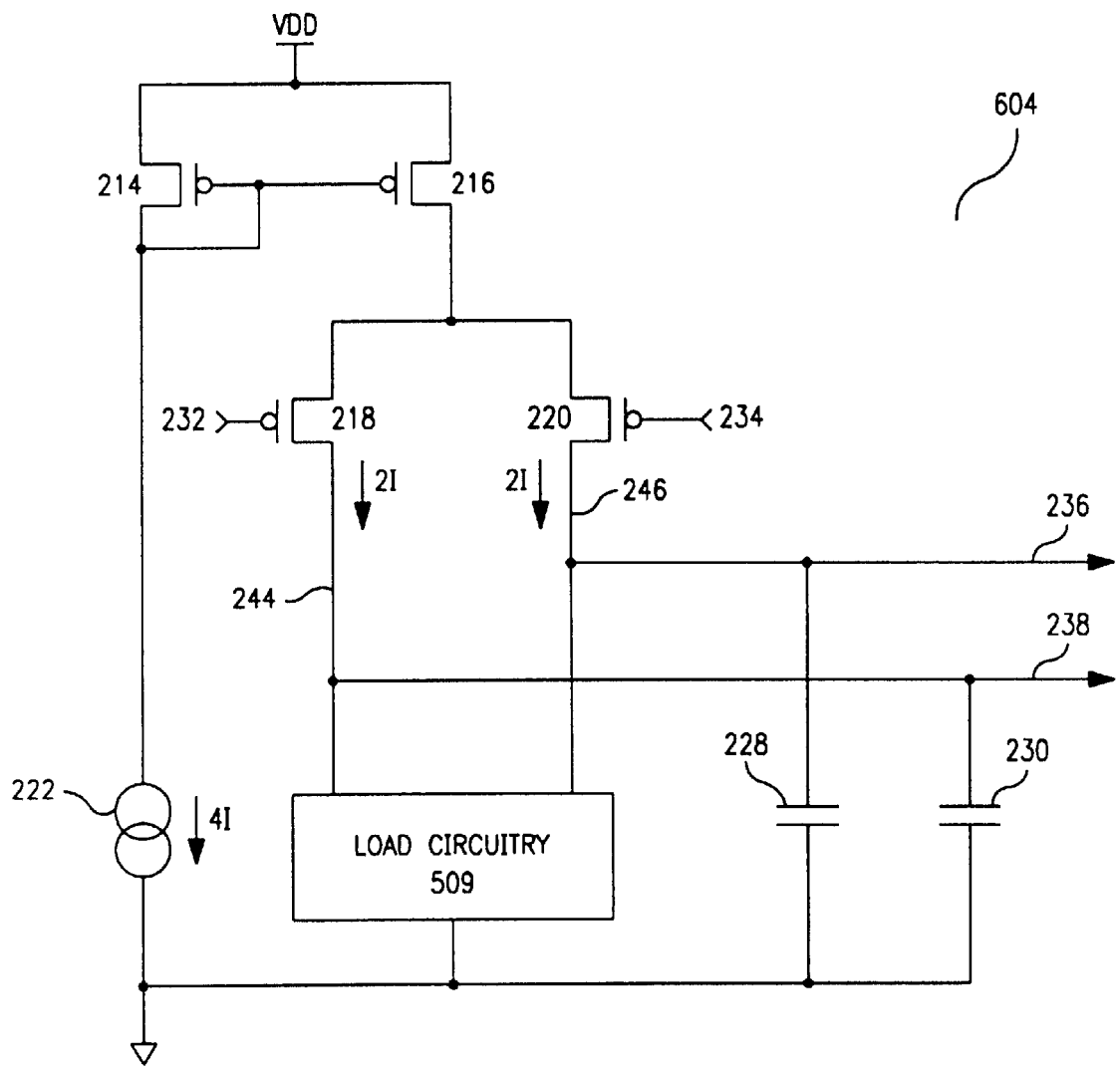
FIG. 12 is a circuit diagram of another embodiment of a low pass filter.

FIG. 12 illustrates low pass filter 604 that may be used in place of low pass filter 204 in delayed locked circuit 200 of FIG. 3. Low pass filter 604 has a normal mode of operation and a low power mode of operation. Low pass filter 604 operates in its normal mode when delay locked loop circuit 200 operates in its normal mode. Low pass filter 604 operates in its low power mode when delay locked loop circuit 200 operates in its low power mode.

Low pass filter 604 operates in the same fashion as low pass filter 204 of in the normal mode of operation. In the low power mode of operation, capacitors 228 and 230 remain connected to the current steering circuit (p-channel MOSFET transistors 218 and 220) and load circuitry 509. Load circuitry 509 and the voltages on lines 232 and 234 may operate in conjunction to enable low pass filter 604 to retain its phase lock information on capacitors 228 and 230 when low pass filter 604 operates in the low power mode.

For example, in low power mode, the voltages on lines 232 and 234 are driven to a low voltage level causing p-channel MOSFET transistors 218 and 220, respectively, to be on and conduct current. The voltages on lines 232 and 234 may be approximately equal so that p-channel MOSFET transistors 218 and 220 may be capable of conducting the same amount of current if p-channel MOSFET transistors 218 and 220 are approximately equal in size. Alternatively, p-channel MOSFET transistors 218 and 220 may be sized differently and the voltages supplied on lines 232 and 234, respectively, may be adjusted so that p-channel MOSFET transistors 218 and 220 may be capable of supplying the same amount of current onto lines 244 and 246, respectively.

Load circuitry 509 may comprise any type of load circuitry that causes the currents supplied to p-channel MOSFET transistors 218 and 220 to be approximately equal. If the current on lines 244 and 246 are approximately equal, then they may be approximately one-half the current supplied by current source 222. For example, if the current supplied by charging current source 222 is 4I $\mu$A, then the current supplied by each of p-channel MOSFET transistors 218 and 220 may be 2I $\mu$A.

If the currents on lines 244 and 246 are approximately equal and constant in the low power mode, then generally no charge will flow to or from capacitors 228 and 230 in the low power mode. Therefore, the loop state information will be retained on capacitors 228 and 230 when low pass filter 504 enters the low power mode.

Figure 13:
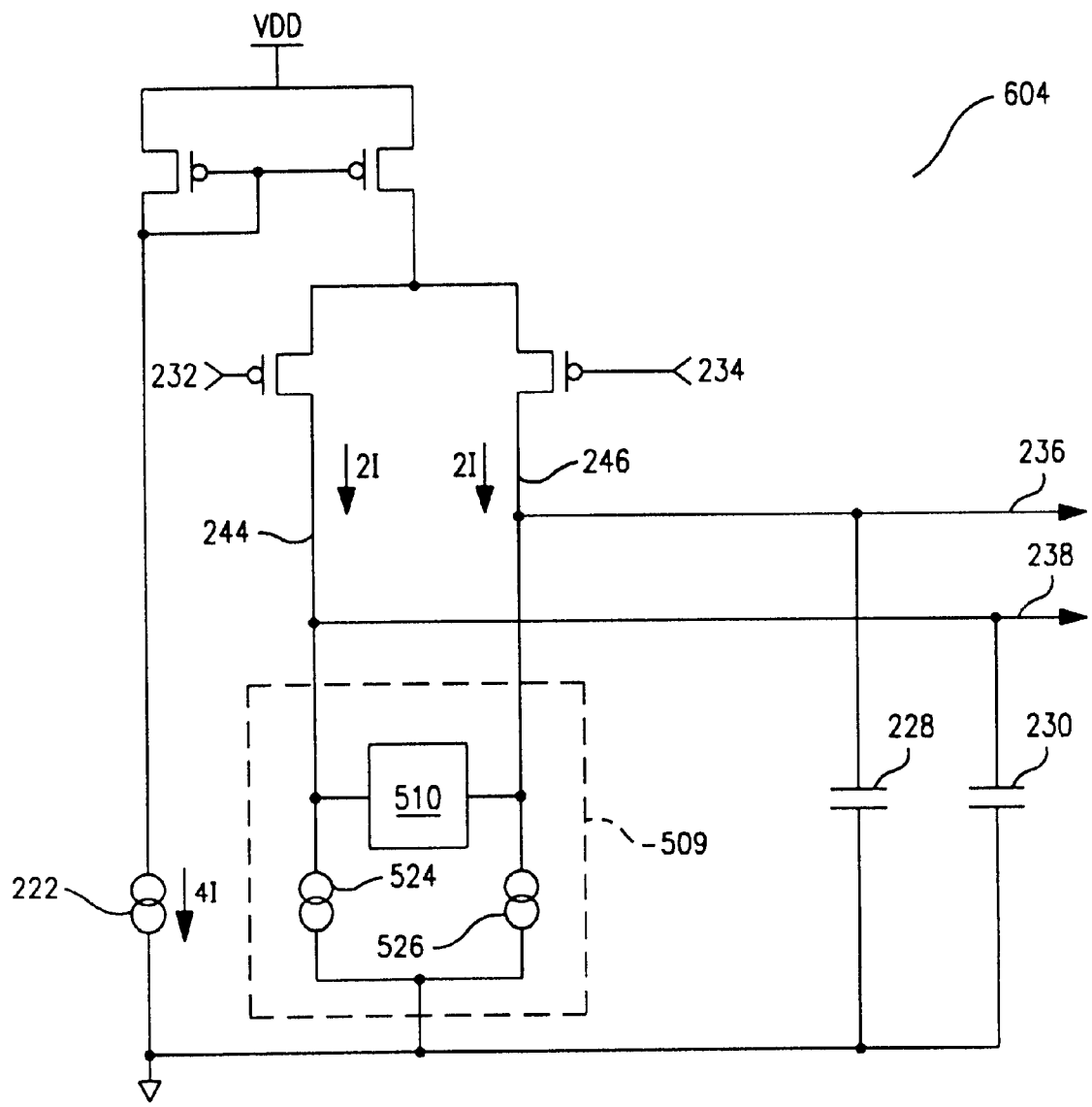
FIG. 13 is a circuit diagram of one embodiment of the low pass filter of FIG. 12.

FIG. 13 illustrates low pass filter 604 including one embodiment of load circuitry 509. Load circuitry 509 includes common mode circuitry 510 and discharging current circuitry including discharging current sources 524. and 526. Common mode circuitry 510 functions in a similar manner to common mode circuitry 210 of FIG. 3 and causes approximately equal currents to flow through lines 244 and 246 regardless of the voltages on lines 236 and 238. Discharging current sources 524 and 526 may comprise any current source circuitry that causes approximately equal currents to flow through lines 244 and 246 when low pass filter 604 operates in the low power mode. For one embodiment, discharging current sources 524 and 526 draw 21 µA each.

Figure 14:
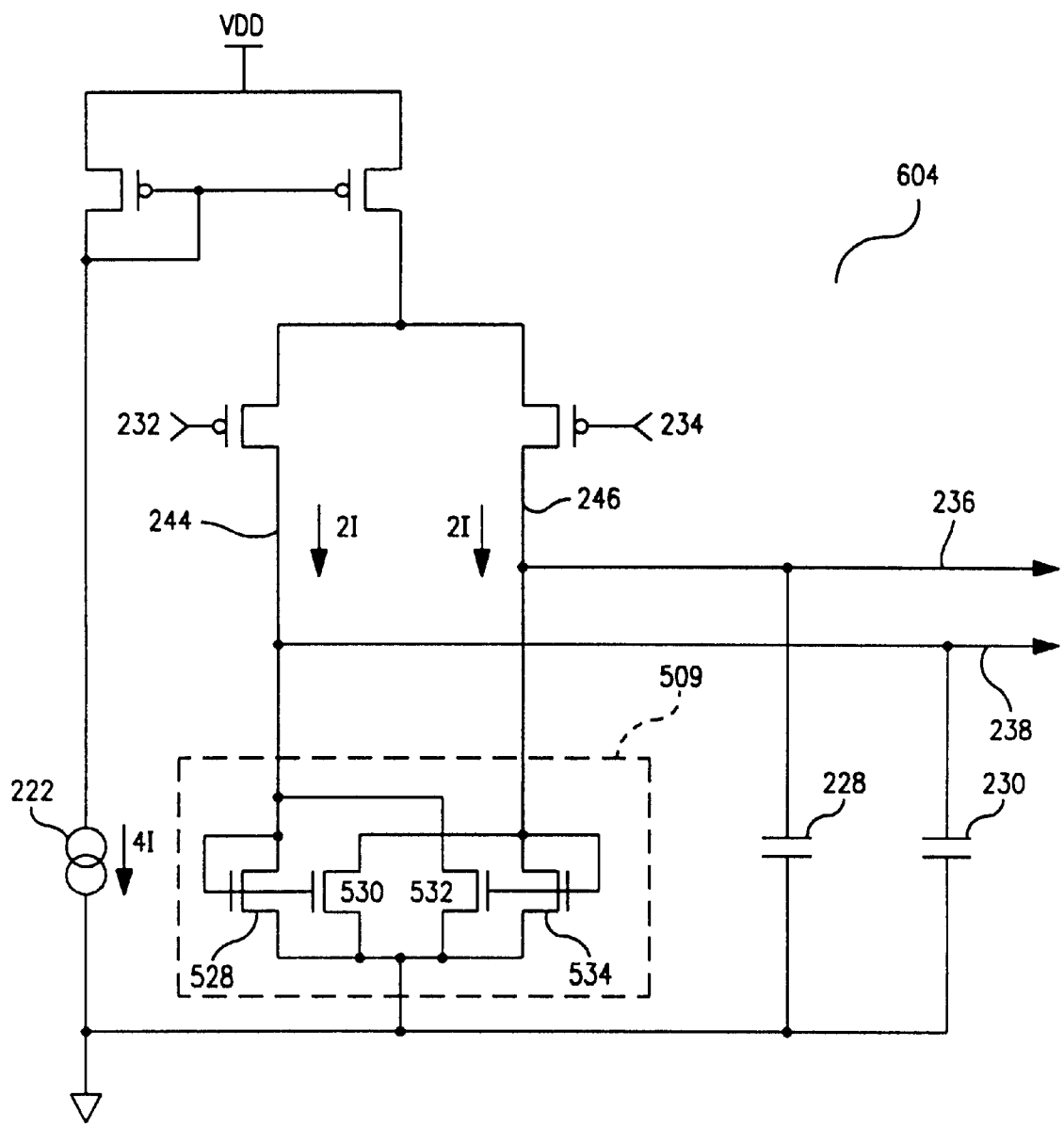
FIG. 14 is a circuit diagram of another embodiment of the low pass filter of FIG. 12.

FIG. 14 illustrates low pass filter 604 including another embodiment of load circuitry 509. Load circuitry 509 includes n-channel MOSFET transistors 528, 530, 532, and 534. N-channel MOSFET transistor 528 has its source coupled to ground, and its drain and gate coupled to line 244. N-channel MOSFET transistor 530 is coupled in a current mirror configuration with transistor 528, and has its gate coupled to the gate of n-channel MOSFET transistor 528, its source coupled to ground, and its drain coupled to line 246. N-channel MOSFET transistor 534 has its source coupled to ground, and its drain and gate coupled to line 246. N-channel MOSFET 532 is coupled in a current mirror configuration with n-channel MOSFET transistor 534, and has its gate coupled to the gate of n-channel MOSFET transistor 534, its source coupled to ground, and its drain coupled to line 244.

If each of n-channel MOSFET transistors 528, 530, 532, and 534 is capable of drawing I µA of current, then this may cause approximately 2I µA to flow through each of lines 244 and 246 when low pass filter 504 operates in low power mode.

Figure 18:
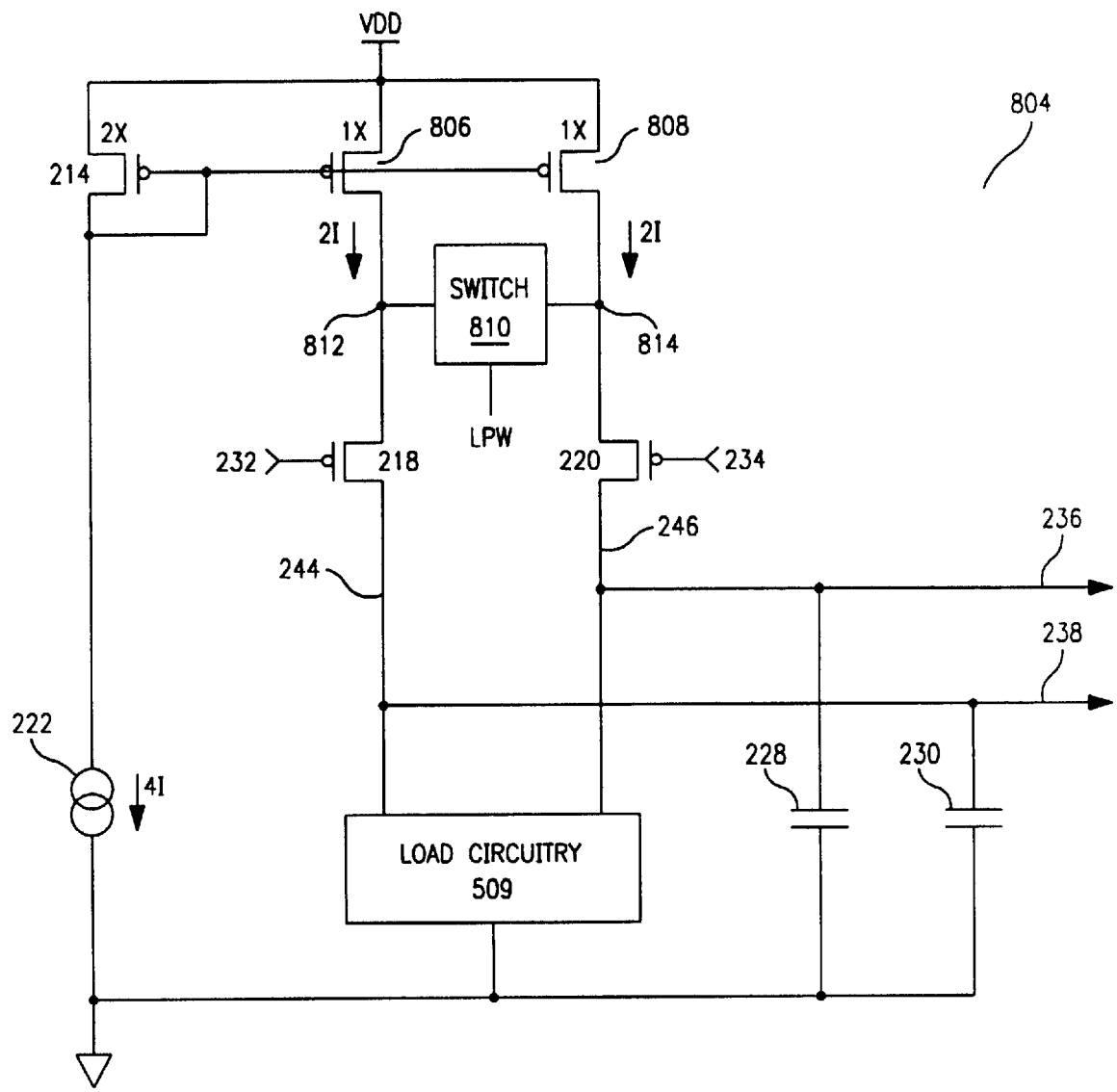
FIG. 18 is a circuit diagram of another embodiment of a low pass filter.

With respect to low pass filter 604 of FIG. 12, non-zero voltages on lines 236 and 238 may cause different currents to flow through p-channel MOSFETs 218 and 230 even when these transistors are perfectly matched. This may be addressed by low pass filter 804 of FIG. 18 which may be used in place of low pass filter 204 in delay locked loop circuit 200. As explained in more detail below, low pass filter 804 includes a differential pair/current source circuit that may be transformed into two equal but separate cascoded current sources when low pass filter 804 operates in a lower power mode.

Low pass filter 804 has a normal mode of operation and a low power mode of operation. Low pass filter 804 operates in its normal mode when delay locked loop circuit 200 operates in its normal mode. Low pass filter 804 operates in its low power mode when delay locked loop circuit 200 operates in its low power mode.

Low pass filter 804 has low power circuitry including switch 810 that is responsive to low power signal LPW. For one embodiment, switch 810 may include one or more p-channel MOSFETs, n-channel MOSFETs, CMOS transmission gates (receiving LPW and its complement LPW*), or any other type of switch element. For example, switch 810 may be a p-channel MOSFET having its source (drain) coupled to node 812, its drain (source) coupled to node 814, and its gate coupled to LPW. When LPW is in a first state, switch 810 couples node 812 to node 814. When LPW is in a second state, switch 810 decouples node 812 from 814.

When low pass filter 804 operates in a normal mode, LPW is in the first state such that switch 810 couples node 812 to node 814. Two separate charging currents will be generated by charging current source circuitry that includes current source 222 and a current mirror circuit formed by p-channel MOSFETs 214, 806, and 808. The first charging current is supplied to node 812 by p-channel MOSFET 806, and the second charging current is supplied to node 814 by p-channel MOSFET 808. The charging currents may be substantially equal given the current mirror configuration of p-channel MOSFETs 214, 806, and 808. For alternative embodiments, other circuits may be used to provide substantially equal charging currents to nodes 812 and 814 (e.g., two separate current sources).

The width to length ratios of p-channel MOSFETs 214, 806, and 808 may be sized such that approximately one-half of the current supplied by current source 222 is supplied by each of the charging currents. For example, the width to length ratio of p-channel MOSFET 214 may be approximately twice the width to length ratio of p-channel MOSFETs 806 and 808. For one embodiment, if the current source supplies approximately 4I µA, then each charging current may supply approximately 2I µA. For alternative embodiments, the charging currents may be a different fraction of the current source.

The charging currents are supplied to the current steering circuitry formed by p-channel MOSFETs 218 and 220. The voltages on lines 232 and 234 will determine whether the charging currents are steered to capacitor 228 and load circuitry 509 through p-channel MOSFET 220, or to capacitor 230 and load circuitry 509 through p-channel MOSFET 218. For example, when the voltage on line 232 is high and the voltage on line 234 is low, the second charging current will be supplied to node 814 and the first charging current will also be supplied to node 814 through switch 810. When the voltage on line 234 is high and the voltage on line 232 is low, the first charging current will be supplied to node 812 and the second charging current will also be supplied to node 812 through switch 810.

Figure 1C:
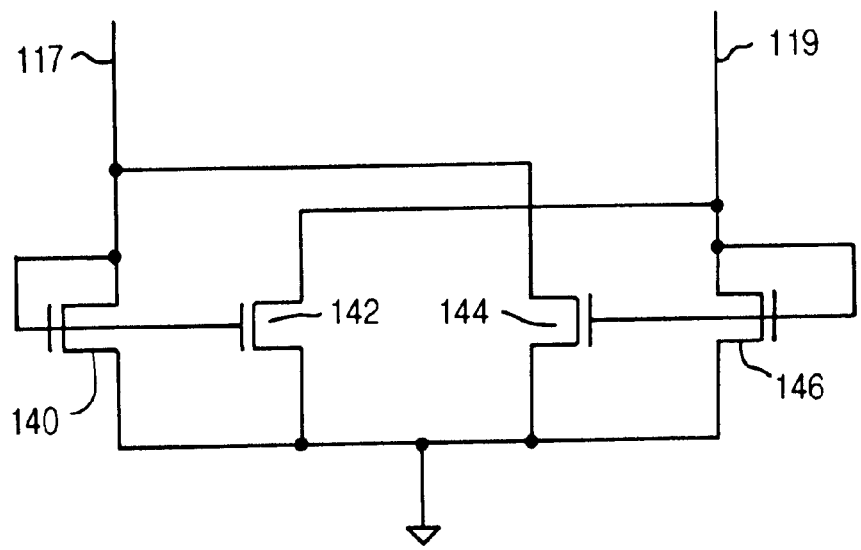
Figure 2:
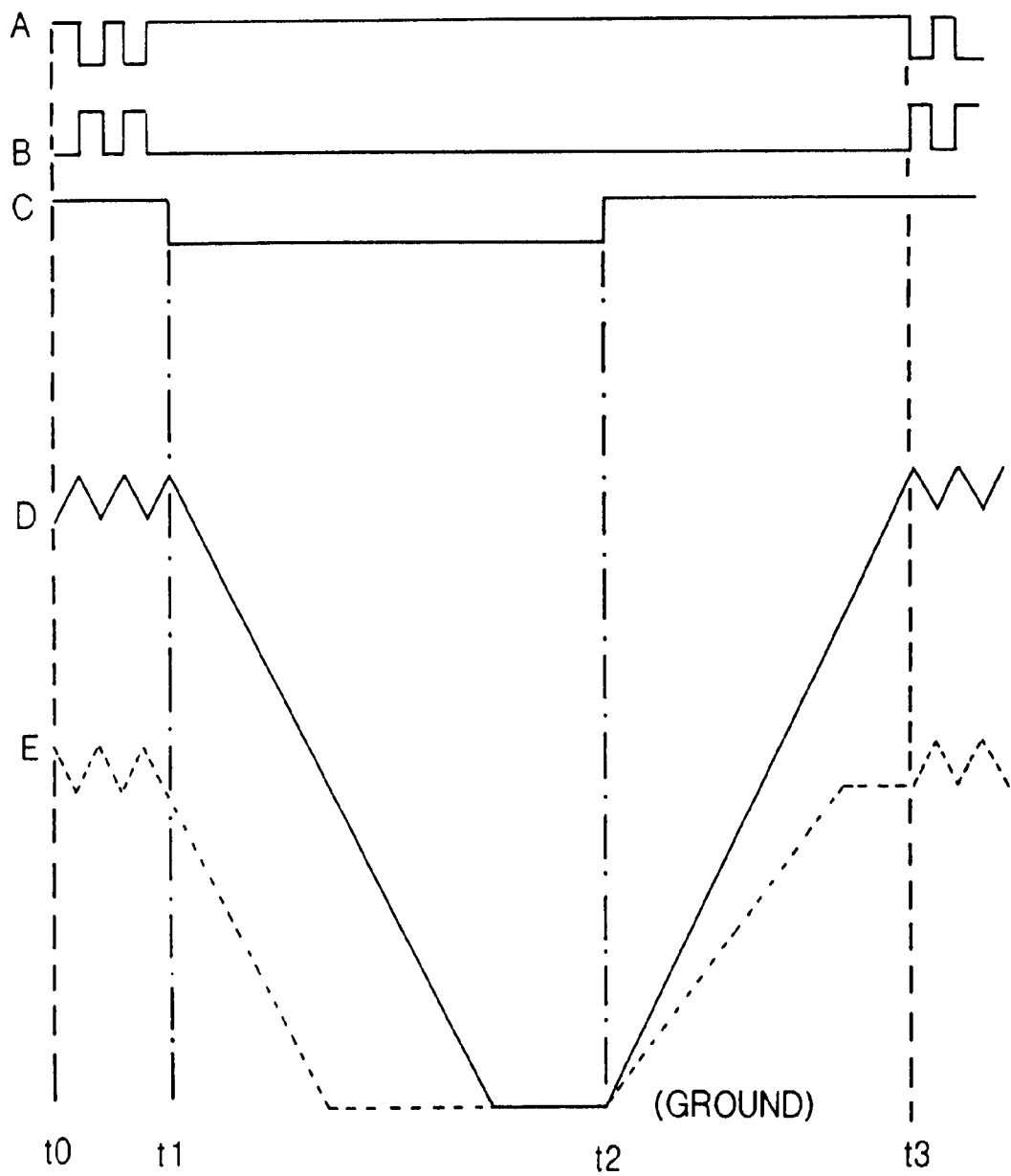
FIG. 2 is a waveform diagram illustrating the change in the differential loop state information as the delay locked loop circuit of FIG. 1a transitions from normal operating mode to low power mode and back to normal operating mode.

In the low power mode of operation, capacitors 228 and 230 remain connected to p-channel MOSFET transistors 218 and 220 and load circuitry 509, and the voltages on lines 232 and 234 are driven low causing p-channel MOSFET transistors 218 and 220 to be on and conduct current. LPW is in the second state during the low power mode of operation such that switch 810 is open and node 812 is decoupled from node 814. The charging currents may then each supply approximately equal amounts of current to load circuitry 509 and capacitors 228 and 230 through p-channel MOSFETs 218 and 220, respectively. Load circuitry 509 and the voltages on lines 232 and 234 may operate in conjunction to enable low pass filter 804 to retain its phase lock information on capacitors 228 and 230 when low pass filter 804 operates in the low power mode. Load circuitry 509 may comprise any type of load circuitry including the load circuitry illustrated in FIGS. 1B and 1C.

The voltages on lines 232 and 234 may be approximately equal so that p-channel MOSFET transistors 218 and 220 may be capable of conducting the same amount of current if p-channel MOSFET transistors 218 and 220 are approximately equal in size. Alternatively, p-channel MOSFET transistors 218 and 220 may be sized differently and the voltages supplied on lines 232 and 234, respectively, may be adjusted so that p-channel MOSFET transistors 218 and 220 may be capable of supplying the same amount of current onto lines 244 and 246, respectively.

When switch 810 decouples node 812 from node 814, line 236 sees a cascode network including p-channel MOSFETs 220 and 808. Similarly, line 238 sees a cascode network including p-channel MOSFETs 218 and 806. Such cascode circuits may cause the currents through p-channel MOSFETs 218 and 220 to be approximately equal even when the voltages on lines 236 and 238 are unequal. If the currents on lines 244 and 246 are approximately equal and constant in the low power mode, then substantially no charge will flow to or from capacitors 228 and 230 in the low power mode. Therefore, the loop state information will be retained on capacitors 228 and 230 when low pass filter 804 is in the low power mode.

Figure 15:
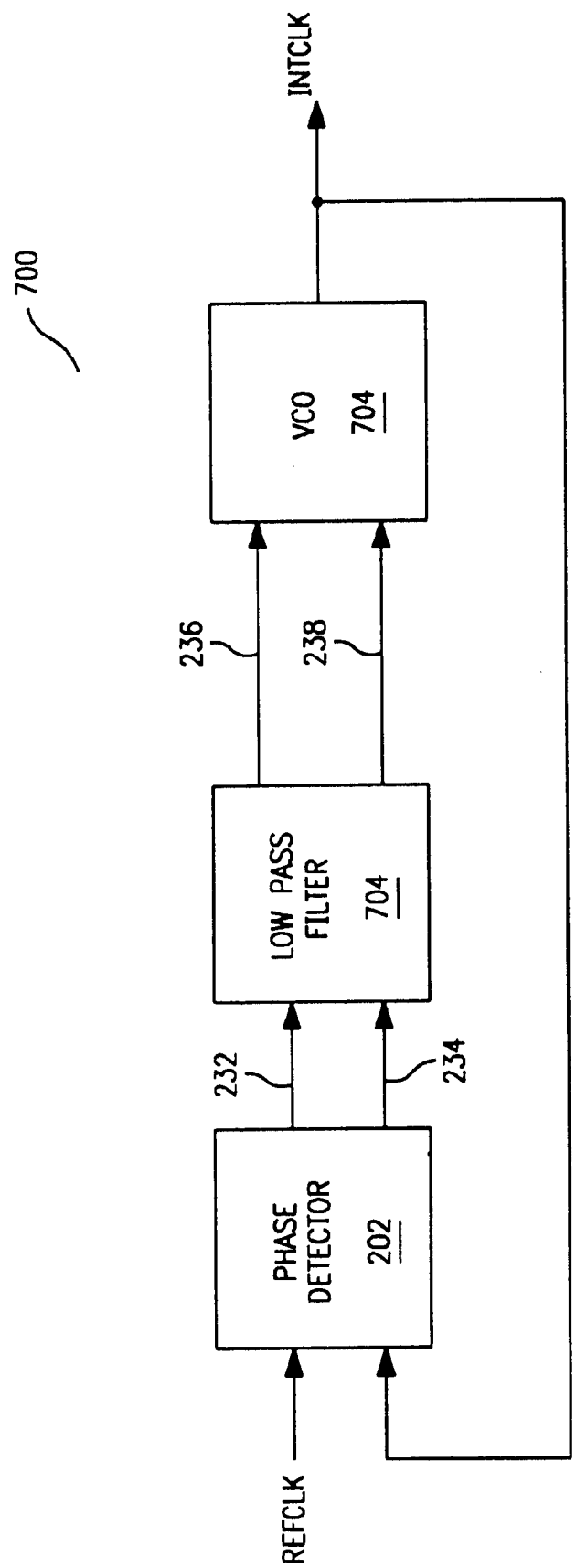
FIG. 15 is a circuit diagram of a phase locked loop circuit including a phase detector, a voltage controlled oscillator, and a low pass filter.

FIG. 15 illustrates a phase locked loop circuit 600 including a low pass filter 704 which may include any of the low pass filters 204, 304, 404, 504, 604 or 804 previously described. As in delayed locked loop circuit 200, phase locked loop circuit 600 includes phase detector 202 receiving REFCLK and INTCLK.

Phase locked loop circuit 600 operates in a normal operating mode and a standby mode of operation. In the normal mode of operation, phase detector 202 outputs signals on lines 232 and 234 to low pass filter 704 indicating whether REFCLK should be adjusted relative to INTCLK. Low pass filter 704 provides control voltages on lines 236 and 238 to voltage controlled oscillator (VCO) 606 indicating an amount of time that VCO should adjust INTCLK.

In the standby mode of operation, REFCLK is shut off or is disabled for a period of time. In the standby mode of operation, low pass filter 704 retains the loop state information of when the phase locked circuit 600 was locked, and low pass filter 704 may operate as in the low power mode previously described with respect to low pass filter circuits 204, 304, 404, 504, 604, and 804. This enables INTCLK to continue operating when REFCLK is turned off.

Low pass filters 204, 304, 404, 504, 604, and 804 may each be used in delay locked loop circuits or phase locked loop circuits having component parts other than those illustrated in FIGS. 3, 5, 7, 9, 12–15, and 18 as will understood by one skilled in the art. Additionally, low pass filters 204, 304, 404, 504, 604, and 804 may be used in other types of circuits including duty cycle corrector circuits or other circuits using a long term averaging (integrating) low pass filter circuit having a standby mode and a low power mode of operation.

Figure 16:
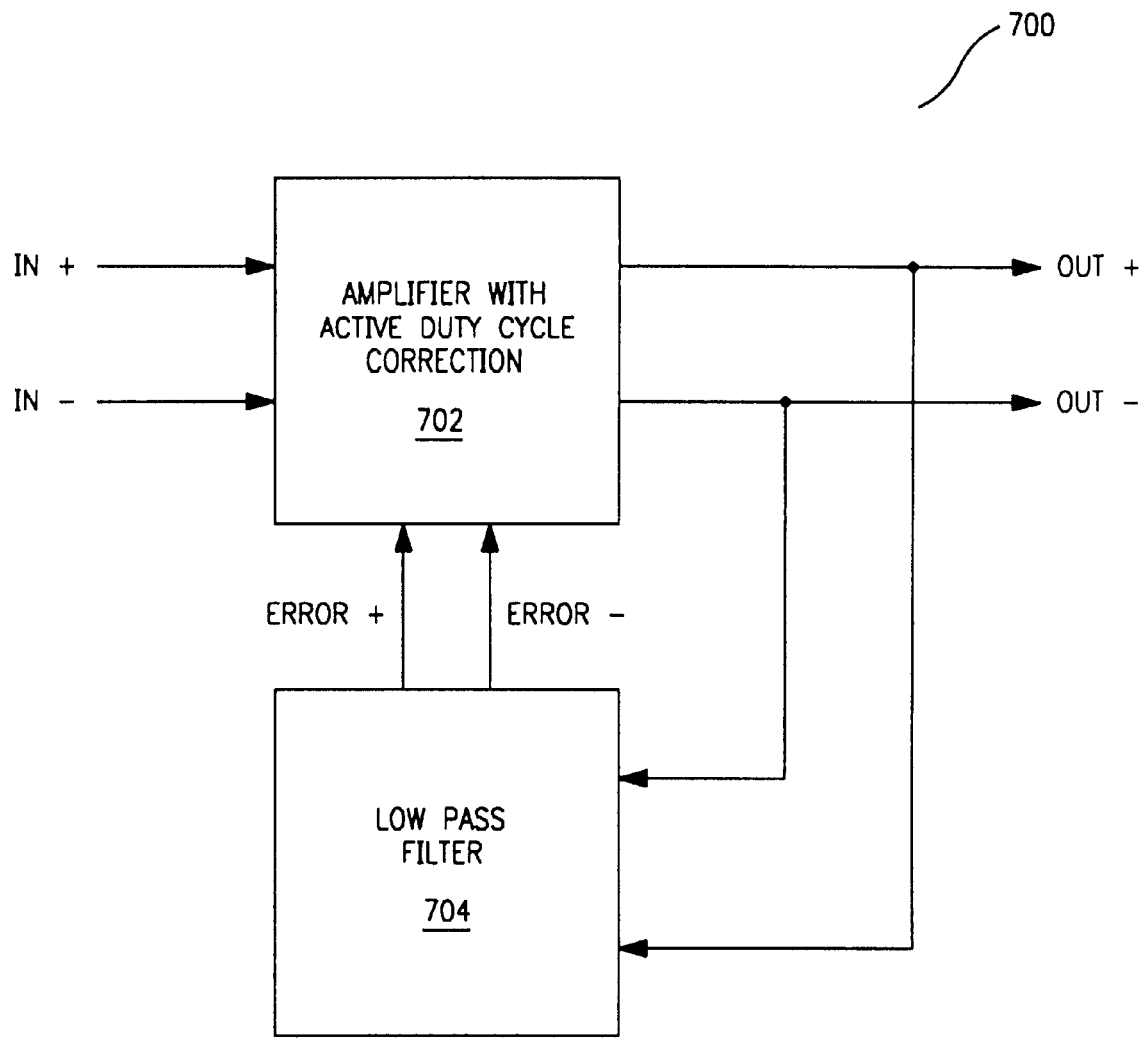
FIG. 16 is a block diagram of a duty cycle correction circuit including an amplifier and a low pass filter.

FIG. 16 shows a duty cycle correction circuit 700 including amplifier 702 with active duty cycle correction and low pass filter 704. Duty cycle correction circuit 700 actively corrects the duty cycle of a periodic signal such as a clock signal. Low pass filter 704 may be any of previously described low pass filters 204, 304, 404, 504, 604, or 804 and may operate in a normal mode of operation and a low power mode of operation.

Amplifier 702 receives differential input signal IN+ and IN− that contains some duty cycle error. Without the addition of low pass filter 704, amplifier 702 will generate differential output signal OUT+ and OUT− that contains a duty cycle error substantially the same as IN+ and IN−. Low pass filter 704 measures the duty cycle error of OUT+ and OUT− and generates differential error signal ERROR+ and ERROR− that are coupled to amplifier 702. The error signals cause amplifier 702 to vary the duty cycle of OUT+ and OUT−. Low pass filter 704 generates ERROR+ and ERROR− such that OUT+ and OUT− are varied to a predetermined duty cycle. For one embodiment, the duty cycle is adjusted to approximately fifty percent.

For one embodiment, OUT+ and OUT− correspond to the signals on lines 232 and 234 of FIGS. 3, 5, 7, 9, 12, and 18. Also, ERROR+ and ERROR− correspond to voltages on lines 236 and 238 of low pass filters 204, 304, 404, 504, 604, and 804.

In the normal mode of operation, low pass filter 704 varies ERROR+ and ERROR− in response to OUT+ and OUT−. In the low power mode of operation, low pass filter 704 maintains voltages or ERROR+ and ERROR− that substantially equal the voltages output by low pass filter 704 prior to switching to low power mode.

Figure 17:
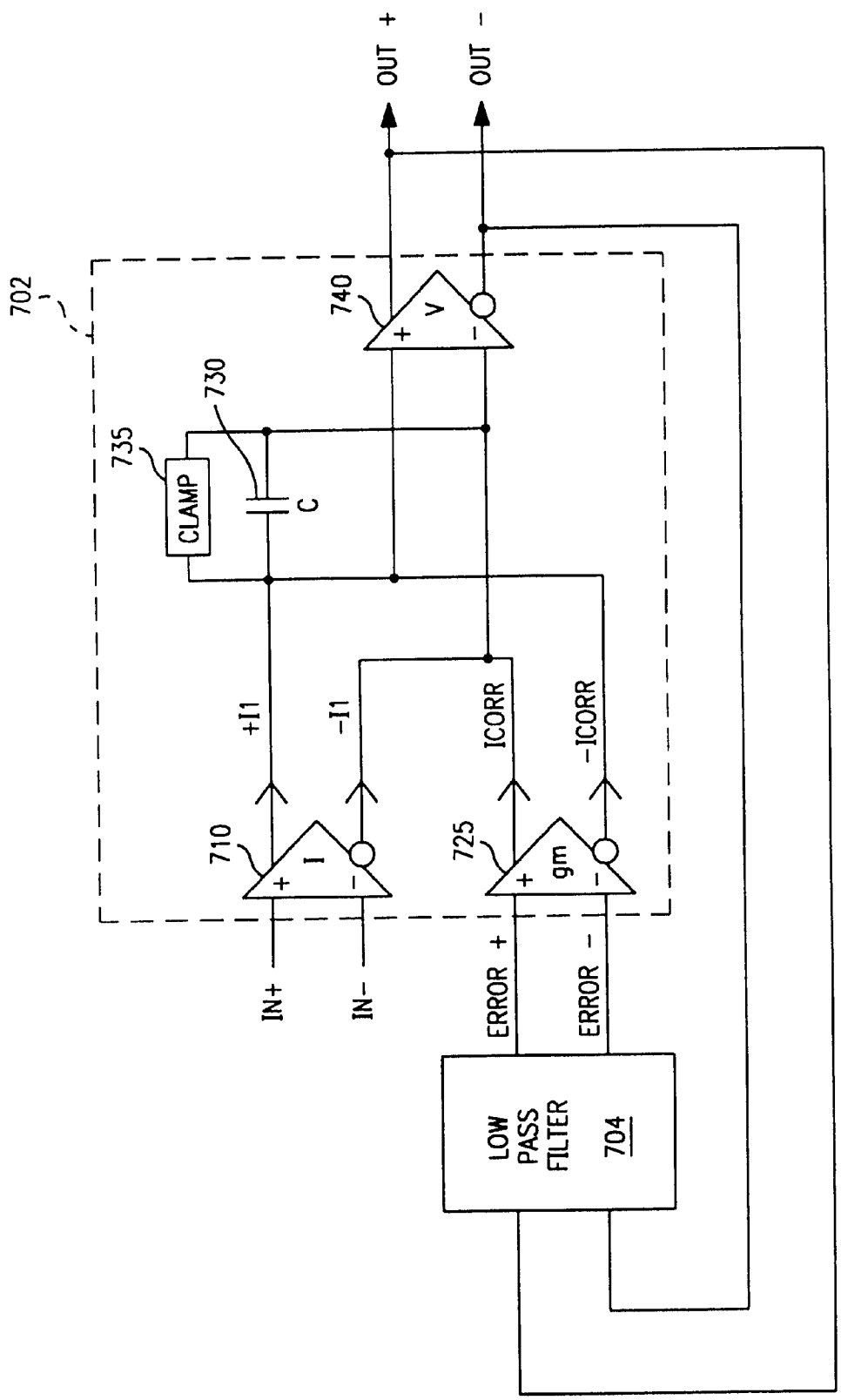
FIG. 17 is a circuit diagram of one embodiment of the duty cycle correction circuit of FIG. 16.

FIG. 17 shows one embodiment of amplifier 702. Amplifier 702 is disclosed in U.S. Pat. No. 5,572,158 entitled, AMPLIFIER WITH ACTIVE DUTY CYCLE CORRECTION wherein the duty cycle error measurement circuit disclosed in FIG. 1 of the patent is replaced with low pass filter 704 in the present application so as to provide a normal power operating mode and a low power operating mode for the duty cycle correction circuit.

Amplifier 702 includes input amplifier 710 that receives differential input signal IN+ and IN−. Amplifier 710 functions substantially as a current switch so that the differential output is approximately +I 1 or −I 1, depending upon the polarity of IN+ and IN−. Amplifier 702 also includes transconductance amplifier 725 which receives ERROR+ and ERROR− and generates current correcting signals ICORR and −ICORR. +I 1 and −ICORR are summed and coupled to one input of amplifier 740, and −I 1 and ICORR are summed and coupled to another input of amplifier 740. The summed differential currents are fed into integrating capacitance 730 in order to generate a slew limited clamped voltage signal. The voltage across integrating capacitance 730 is arranged to have a finite maximum value, so that the capacitor voltage is clamped as well as slew-limited. The voltage across integrating capacitance 730 is clamped by clamping element 735. Amplifier 740 generates OUT+ and OUT−.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. An apparatus, comprising:

current steering circuit having a current carrying output;

a capacitor that includes a first terminal and a second terminal;

an amplifier that includes an input and an output, wherein the input of the amplifier is coupled to the first terminal of the capacitor; and a switch operably coupled to the current carrying output of the current steering circuit, the output of the amplifier, and the first terminal of the capacitor, wherein in a first mode of operation, the switch couples the current carrying output of the current steering circuit to the first terminal of the capacitor such that a voltage is stored on the capacitor, and wherein in a second mode of operation, the switch couples the output of the amplifier to the current carrying output of the current steering circuit.

2. The apparatus of claim 1, further comprising:

a charging current source that provides current to the current steering circuit.

3. The apparatus of claim 1, wherein the amplifier is a unity gain amplifier.

4. The apparatus of claim 1, further comprising:

a voltage controlled oscillator coupled to the first terminal of the capacitor.

5. The apparatus of claim 1, further comprising:

a voltage controlled delay line coupled to the first terminal of the capacitor.

6. The apparatus of claim 1, further comprising a voltage controlled oscillator coupled to the current carrying output of the current steering circuit and the first terminal of the capacitor.

7. The apparatus of claim 1, wherein the current steering circuit comprises first and second current carrying outputs, and wherein the apparatus further comprises:

a first additional capacitor coupled to the second current carrying output;

a first additional switch coupled between the first current carrying output and the first terminal of the capacitor;

a second additional switch coupled between the second current carrying output and the second capacitor;

wherein the first additional switch and the second additional switch are opened to prevent current flow during the first mode of operation, and wherein the first additional switch and the second additional switch are closed to allow current flow during the second mode of operation.

8. The apparatus of claim 7, wherein each one of the the switch, the first additional switch, and the second additional switch comprises a transistor.

9. The apparatus of claim 7 further comprising a charging current source feeding the current steering circuit, wherein the charging current source comprises a first current mirror circuit.

10. A locked loop circuit having a first mode of operation and a second mode of operation, said locked loop circuit having a low pass filter that includes a charging circuit, said low pass filter comprising:

a charging current source;

a first current steering element coupled to the charging current source and having an input for receiving a first signal;

a second current steering element coupled to the charging current source and having an input for receiving a second signal;

a first switch circuit and a first capacitor that receive a first current from the first current steering element, the first switch circuit closed during the first mode of operation such that the first current flows from the first steering element to the first capacitor through the first switch circuit, the first switch circuit open during the second mode of operation;

a second switch circuit and a second capacitor that receive a second current from the second current steering element, the second switch circuit closed during the first mode of operation such that the second current flows from the second steering element to the second capacitor through the second switch circuit, the second switch circuit open during the second mode of operation;

a third switch circuit coupled between the first and the second current steering elements such that the third switch circuit is open during the first mode of operation and is closed during the second mode of operation;

load circuitry coupled to the first and second current steering elements such that the load circuitry respectively receives a third and a fourth current from the first and second current steering elements and wherein:

1) during the first mode of operation, the third current helps determine the first current and the fourth current helps determine the second current; and 2) during the second mode of operation, the second and third currents are substantially equal.

11. The locked loop circuit of claim 10, wherein only one of the first and second current steering elements conducts current in response to the first and second signals during the first mode of operation.

12. The locked loop circuit of claim 10 further comprising a voltage controlled oscillator or voltage controlled delay line coupled to the first and second capacitors.

13. The locked loop circuit of claim 10 further comprising:

a phase detector having a first input to receive a first clock signal and a second input to receive a second clock signal, the phase detector having a pair of outputs to provide the first and second signals to the first and second current steering elements.

14. An apparatus, comprising:

first and second charging lines;

first and second capacitive elements coupled to receive respective currents from the first and second charging lines and to develop first and second voltages in response thereto, said first and second capacitive elements being part of a low pass filter, within a locked loop circuit;

a circuit coupled between the first and second charging lines to drive the charging lines to a voltage level between the first and second voltages in response to a control signal that indicates a low power mode is to be entered;

a first amplifier having a first input coupled to the first capacitive element and a second input coupled to the second capacitive element, the first amplifier having a pair of outputs respectively coupled to a pair of outputs from a second amplifier and a pair of inputs to a third amplifier, the second amplifier receiving a differential signal having a duty cycle error, the third amplifier presenting an improved differential signal having reduced duty cycle error, and the third amplifier having a first output coupled to the first charging line and a second output coupled to the second charging line.

15. The apparatus of claim 14 further comprising:

a charging current source; and a current steering circuit coupled to the charging current source and the first and second charging lines.

16. The apparatus of claim 15, wherein the charging current source comprises:

a current source; and a current mirror coupled to the current source and the current steering circuit.

17. The apparatus of claim 14, wherein when the control signal does not indicate the low power mode is to be entered, the first and second capacitive elements are isolated from the first and second charging lines.

18. The apparatus of claim 14 wherein said locked loop circuit is a phase locked loop circuit.

19. The apparatus of claim 18, further comprising:

a phase detector that receives a reference clock signal and an on-chip clock signal, the phase detector generating a pair of signals that are converted into the currents received by the first and second capacitive elements; and a voltage controlled oscillator circuit that produces the on-chip clock signal and receives a differential input voltage that is derived from the first and second voltages.

20. The apparatus of claim 14 wherein said locked loop circuit is a delay locked loop circuit.

21. The apparatus of claim 20, further comprising:

a phase detector that receives a reference clock signal and an on-chip clock signal, the phase detector generating a pair of signals that are converted into the currents received by the first and second capacitive elements; and a voltage controlled delay circuit that produces the on-chip clock signal and receives a differential input voltage that is derived from the first and second voltages.

* * * * *